(12) United States Patent
Scarbrough et al.

(10) Patent No.: US 12,245,426 B2
(45) Date of Patent: Mar. 4, 2025

(54) STAIRCASE FORMATION IN A MEMORY ARRAY

(71) Applicant: Micron Technology, Inc., Boise, ID (US)

(72) Inventors: Alyssa N. Scarbrough, Boise, ID (US); Lifang Xu, Boise, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 169 days.

(21) Appl. No.: 17/822,712

(22) Filed: Aug. 26, 2022

(65) Prior Publication Data
US 2024/0071502 A1   Feb. 29, 2024

(51) Int. Cl.
*H10B 43/20* (2023.01)
*G11C 16/08* (2006.01)
*H01L 21/768* (2006.01)
*H10B 43/35* (2023.01)

(52) U.S. Cl.
CPC ....... *H10B 43/20* (2023.02); *H01L 21/76831* (2013.01); *H01L 21/76843* (2013.01); *H01L 21/76885* (2013.01); *H10B 43/35* (2023.02); *G11C 16/08* (2013.01)

(58) Field of Classification Search
CPC ........ H10B 43/20; H10B 43/35; H10B 43/50; H10B 41/27; H10B 41/50; H10B 43/27; H01L 21/76831; H01L 21/76843; H01L 21/76885; G11C 16/08; G11C 16/0483
See application file for complete search history.

(56) References Cited

U.S. PATENT DOCUMENTS

| | | | | |
|---|---|---|---|---|
| 11,411,013 | B2* | 8/2022 | Jhothiraman | H10B 43/10 |
| 11,665,894 | B2* | 5/2023 | Larsen | H10B 41/50 |
| | | | | 257/774 |
| 2023/0317601 | A1* | 10/2023 | Jain | H10B 41/50 |
| | | | | 257/253 |
| 2024/0071816 | A1* | 2/2024 | Scarbrough | H01L 21/76816 |

* cited by examiner

*Primary Examiner* — Allison Bernstein
(74) *Attorney, Agent, or Firm* — Holland & Hart LLP

(57) ABSTRACT

Methods, systems, and devices for staircase formation in a memory array are described. A first liner material may be deposited on a tread above a first contact surface and a portion of the first liner material may be doped. A second liner material may be deposited over the first liner and a portion of the second liner material may be doped. After doping the portions of the liner materials, the undoped portions of the liner materials may be removed so that the materials above a second contact surface can be at least partially removed via a first removal process. The doped portion of the first liner material may then be cut back so that a second removal process can expose the second contact surface and a third contact (while the first contact surface is protected from the removal process by the liner materials).

10 Claims, 34 Drawing Sheets

STAIRCASE FORMATION IN A MEMORY ARRAY

FIELD OF TECHNOLOGY

The following relates to one or more systems for memory, including staircase formation in a memory array.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
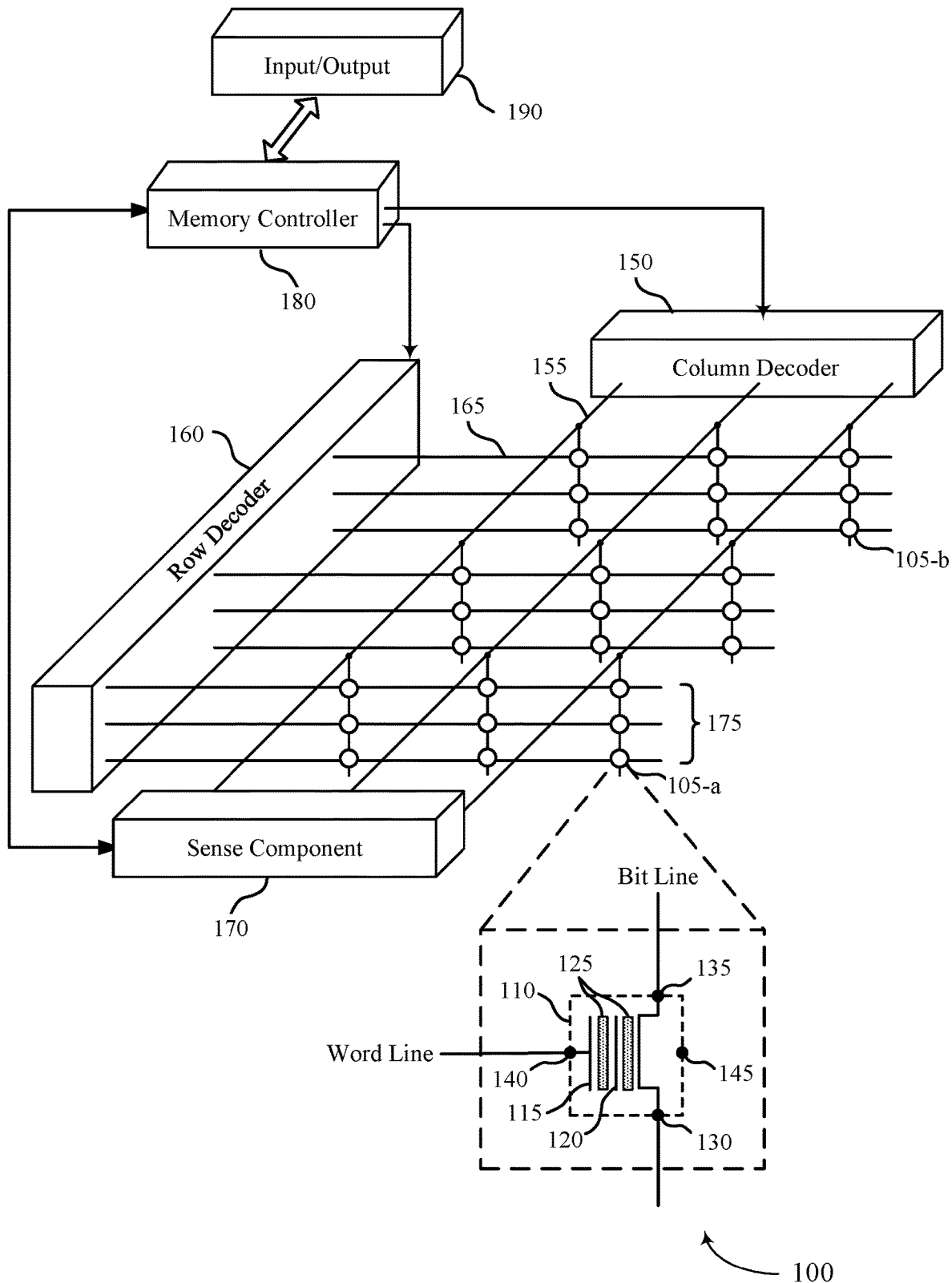
FIG. 1 illustrates an example of a system that supports staircase formation in a memory array in accordance with examples as disclosed herein.

In some memory systems, word line contacts may be used to couple the word lines of memory cells with supporting components. For example, a word line that is coupled with a memory cell may also be coupled with a word line contact that allows the memory system to apply (e.g., via a word line driver) electrical signals to the word line. If the word lines are stacked layers of metal material (e.g., tungsten) in the x-y plane, the word line contacts may be conductive pillars that couple with contact surfaces of the word lines and extend in the z-direction. To prevent shorts between word lines, the contact surfaces may form a staircase pattern where each landing surface is offset from the other and is referred to as a "tread" of the staircase. For example, if the treads (contact surfaces) are in the x-y plane, the staircase may extend widthwise in the x-direction, may extend lengthwise in the y-direction, and may extend height-wise in the z-direction.

As components of memory arrays scale and get smaller to include more memory cells and word lines, the quantity of word line contacts in a memory array may also increase. Instead of adding additional treads for the new word line contacts (which may increase the total area consumed by the word line contacts), it may be desirable to form lateral sub-treads on the treads of a staircase. For example, it may be desirable to form three lateral sub-treads on the treads of the staircase, permitting three times (3x) more word line contacts per unit area relative to other designs. But the manufacturing process used to form the treads may be inadequate to form the sub-treads in the sizes used to increase the quantity of word line contacts and reduce the area used by each word line contact. A lateral sub-tread may also be referred to herein as a contact surface, lateral fold, or other suitable terminology.

The techniques described herein allow for formation of three or more lateral sub-treads (contact surfaces) in a staircase architecture for word line contacts, thus reducing the area consumed by the word line contacts. A staircase with lateral sub-treads may also be referred to herein as a folded staircase.

To form lateral sub-treads (contact surfaces), multiple doped liner materials may be used. For example, a first liner material may be deposited on a tread and a portion of the first liner material may be doped. A second liner material may be deposited over the first liner and a portion of the second liner material may be doped. The doped portions of the first liner material and the second liner material may overlay an area of the tread that will become the first sub-tread. After doping the portions of the liner materials, the undoped portions of the liner materials may be removed so that the materials above the second sub-tread can be at least partially removed via a first removal process. The doped portion of the first liner material may then be cut back so that a second removal process can expose the second sub-tread and the third sub-tread (while the first sub-tread is protected from the removal process by the liner materials). Thus, three lateral sub-treads may be formed on a tread in a staircase architecture for word line contacts.

In an alternative process, the undoped portion of the first liner may be removed before depositing and doping the second liner material.

Features of the disclosure are initially described in the context of systems, devices, and circuits with reference to FIG. 1. Features of the disclosure are described in the context of a material structure with reference to FIGS. 2A through 2Q and FIGS. 3A through 3N. These and other features of the disclosure are further illustrated by and described in the context of flowcharts that relate to staircase formation in a memory array with reference to FIGS. 4 through 5.

FIG. 1 illustrates an example of a memory device 100 that supports staircase formation in a memory array in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells 105, such as memory cell 105-a and memory cell 105-b. In some examples, a memory cell 105 may be a NAND memory cell, such as in the blow-up diagram of memory cell 105-a. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such a memory cell 105 configured as a multi-level cell (MLC), a tri-level cell (TLC), a quad-level cell (QLC), or other type of multiple-level memory cell 105—may be programmed to one state of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-a that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-a is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., a channel between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105 (e.g., as described with reference to FIG. 2).

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. As part of such accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

The word lines 165 may be coupled with various components (e.g., word line drivers) via word line contacts. For example, if the word lines 165 are stacked metal layers in the x-y plane, word line contacts that extend in the z-direction may couple the word lines 165 to word line drivers. The contact surfaces (treads) of the word lines 165 may form a rising staircase (e.g., with each tread higher in the z-direction than the previous tread). To reduce the area consumed by the word line contacts, lateral sub-treads (also referred to as contact surfaces) may be formed in the treads according to the techniques described herein. Specifically, the lateral contact surfaces may be formed using multiple doped liner materials.

Figure 2A:
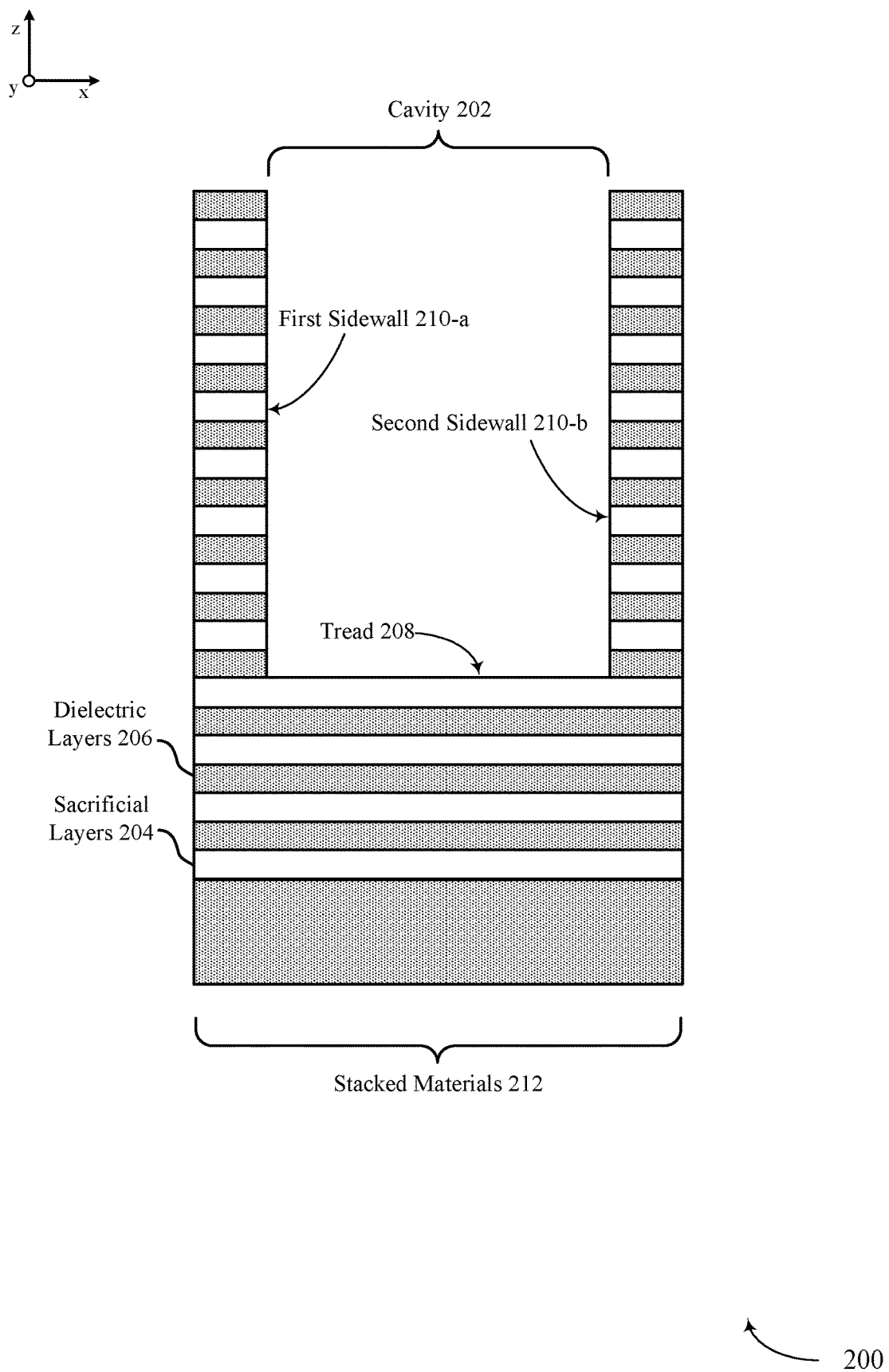
FIGS. 2A through 2Q illustrate an example of a material structure that supports staircase formation in a memory array in accordance with examples as disclosed herein.
Figure 2B:
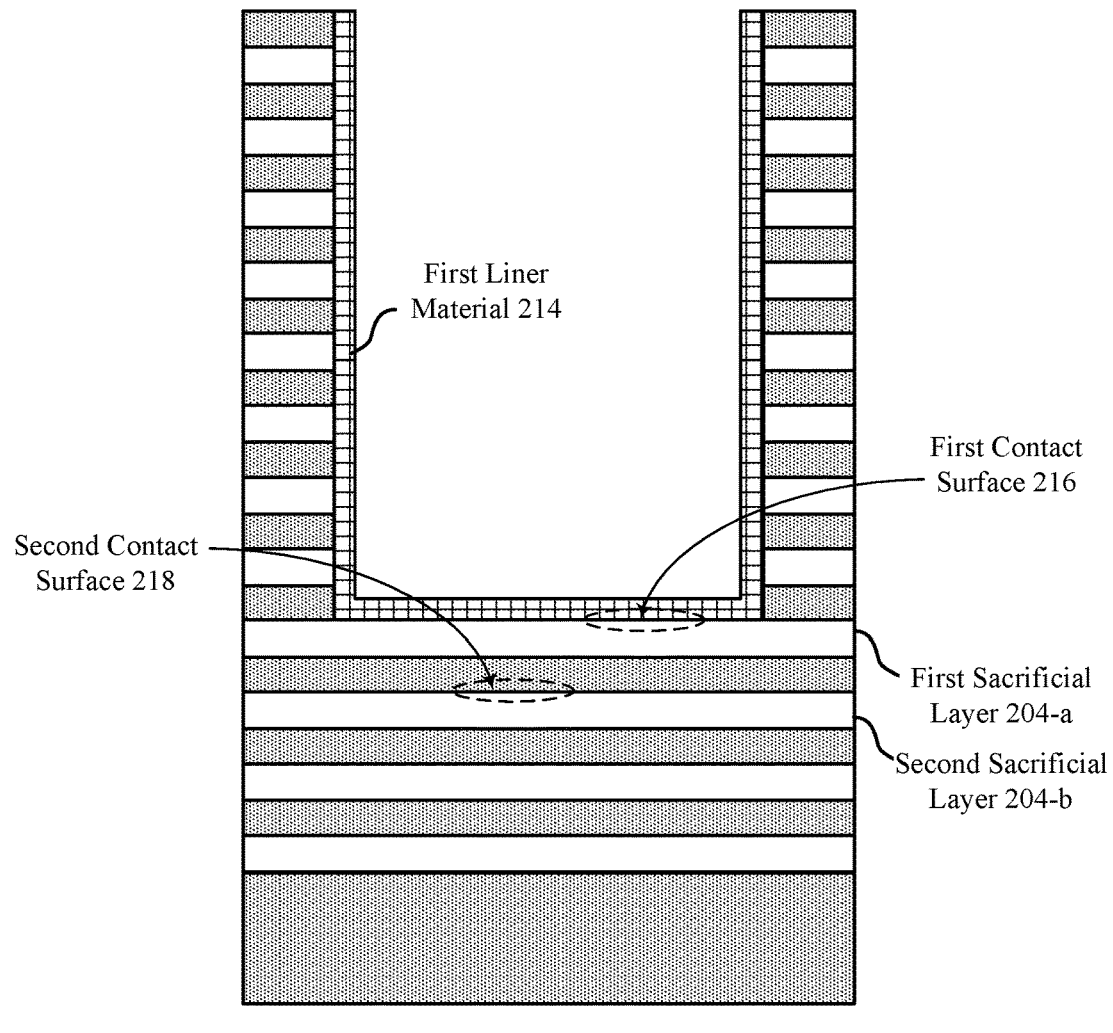
Figure 2C:
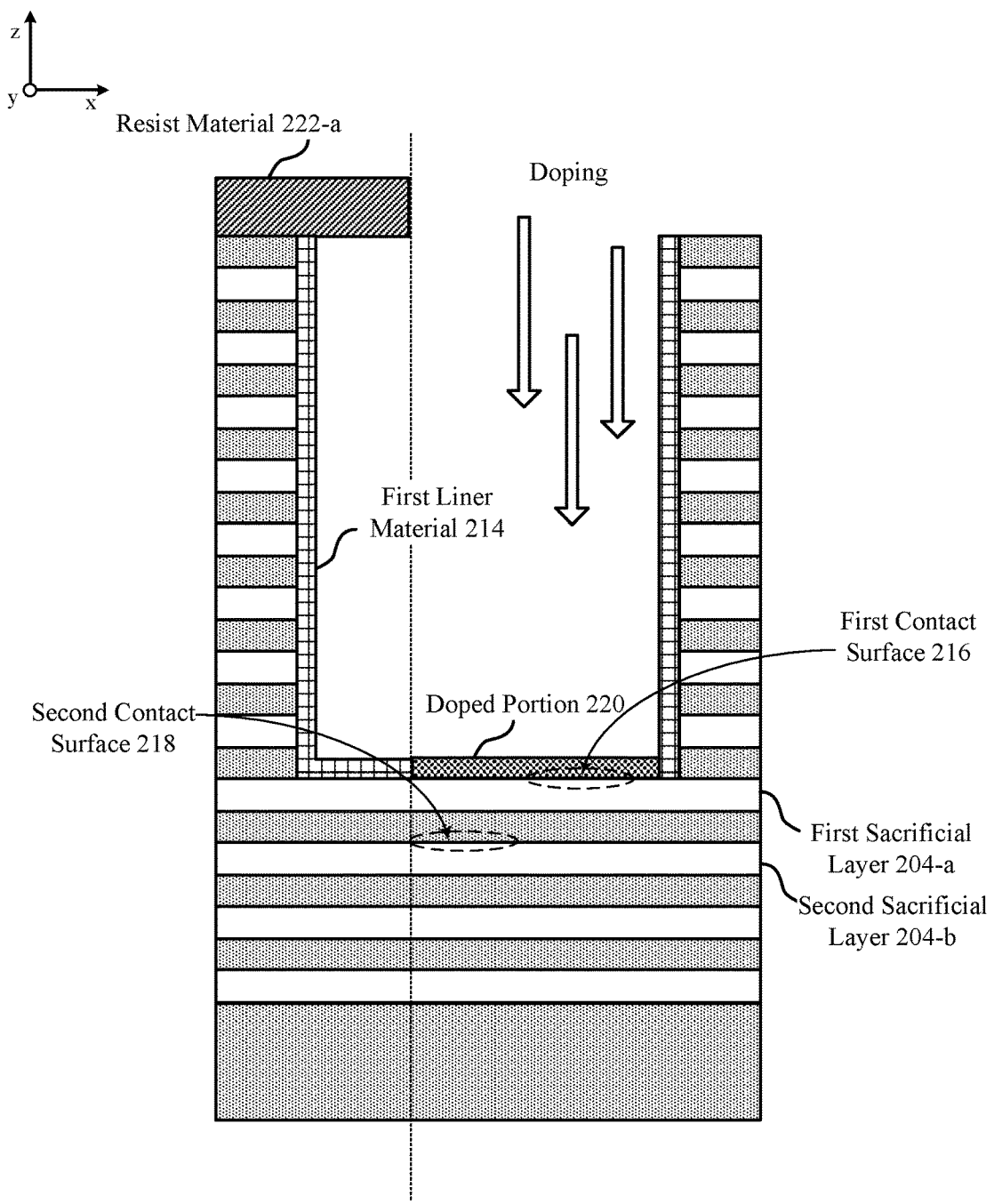
Figure 2D:
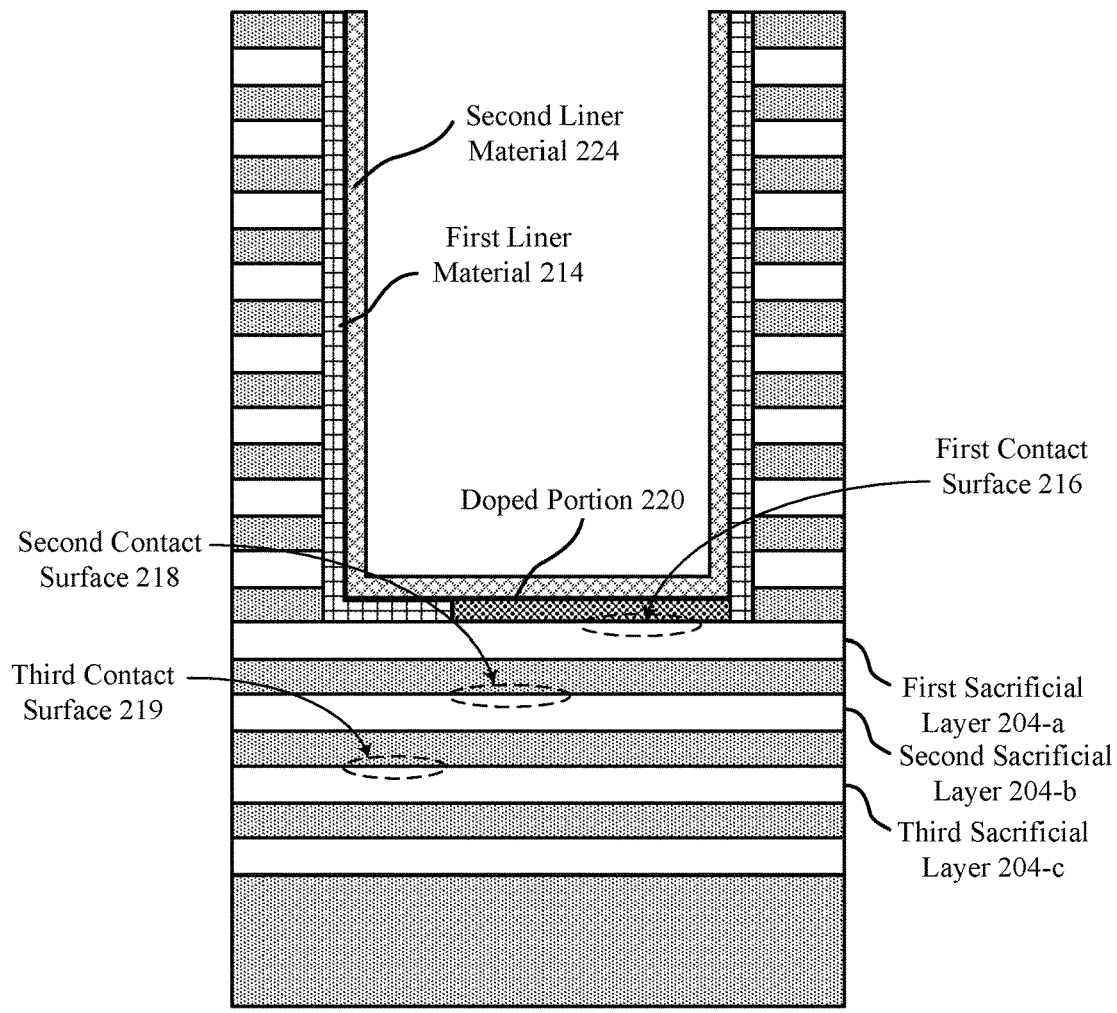
Figure 2E:
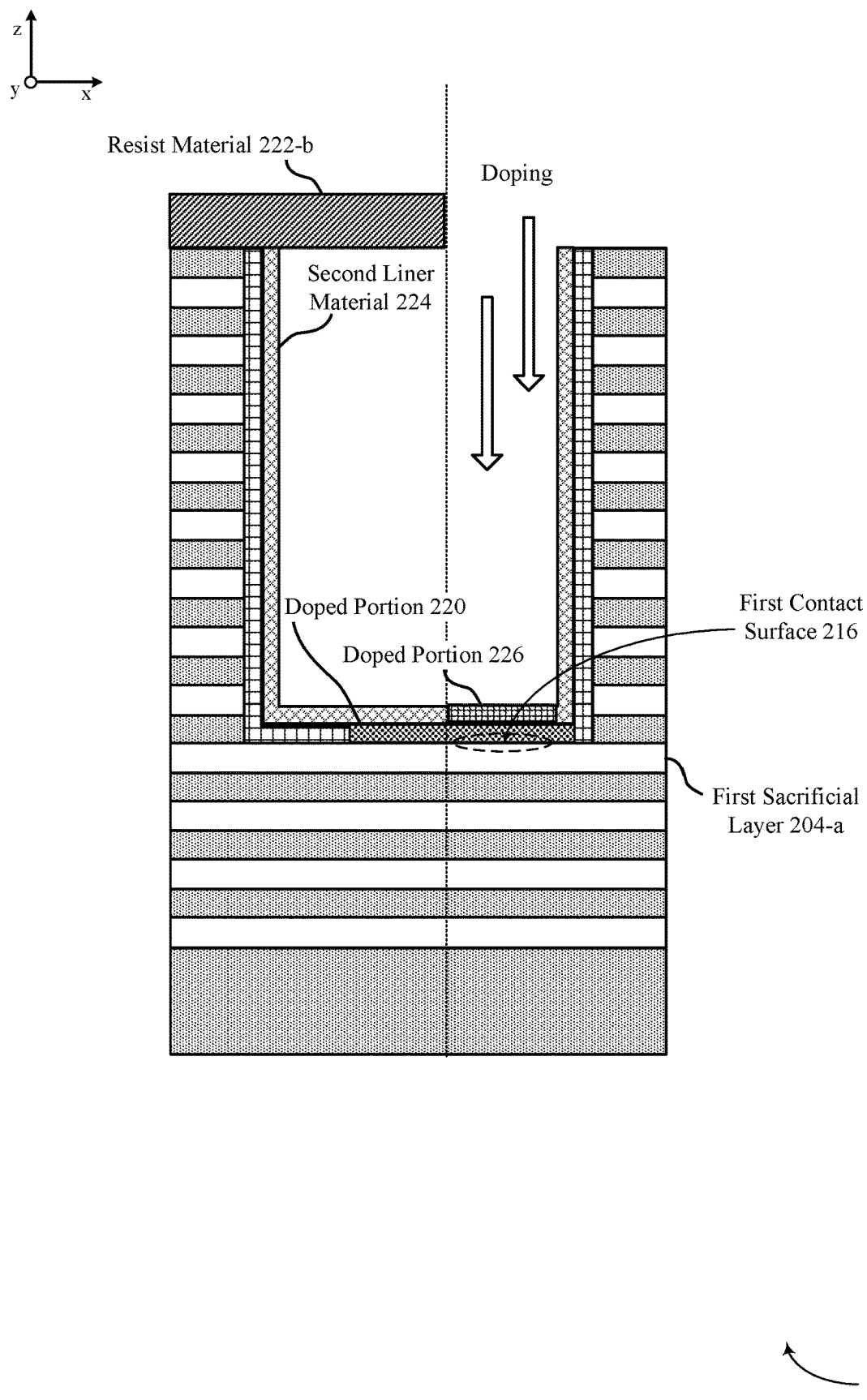
Figure 2F:
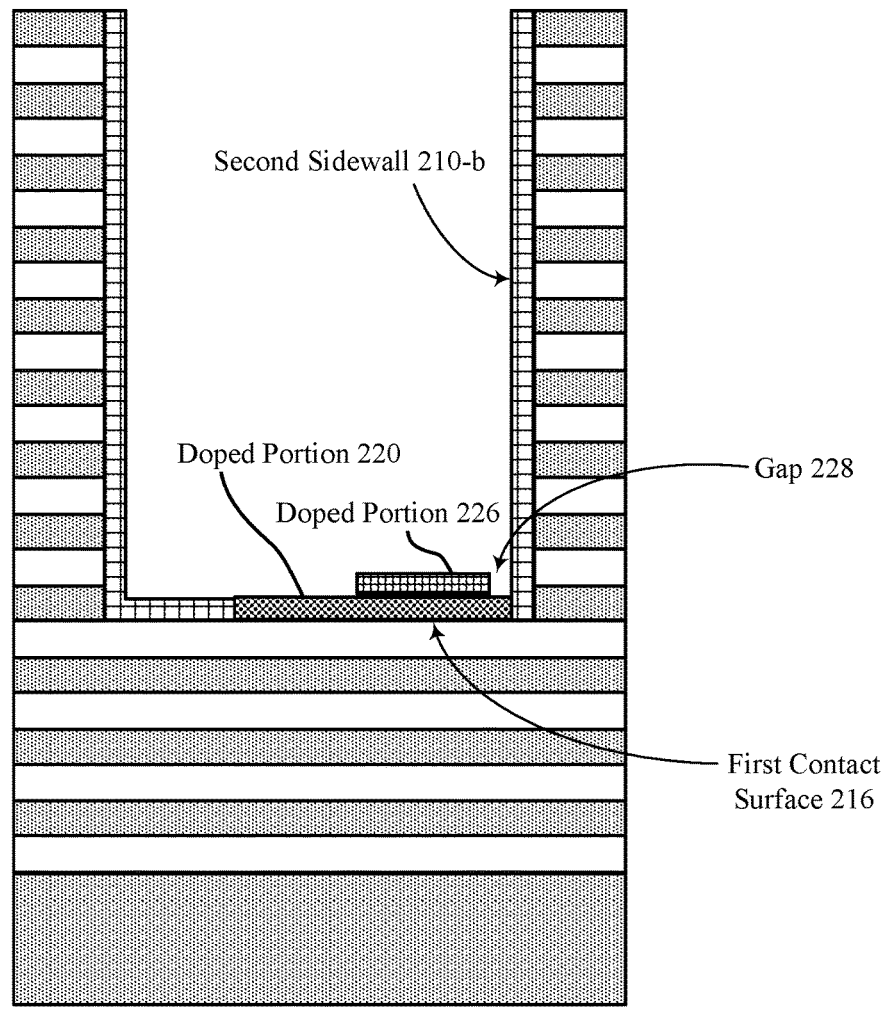
Figure 2G:
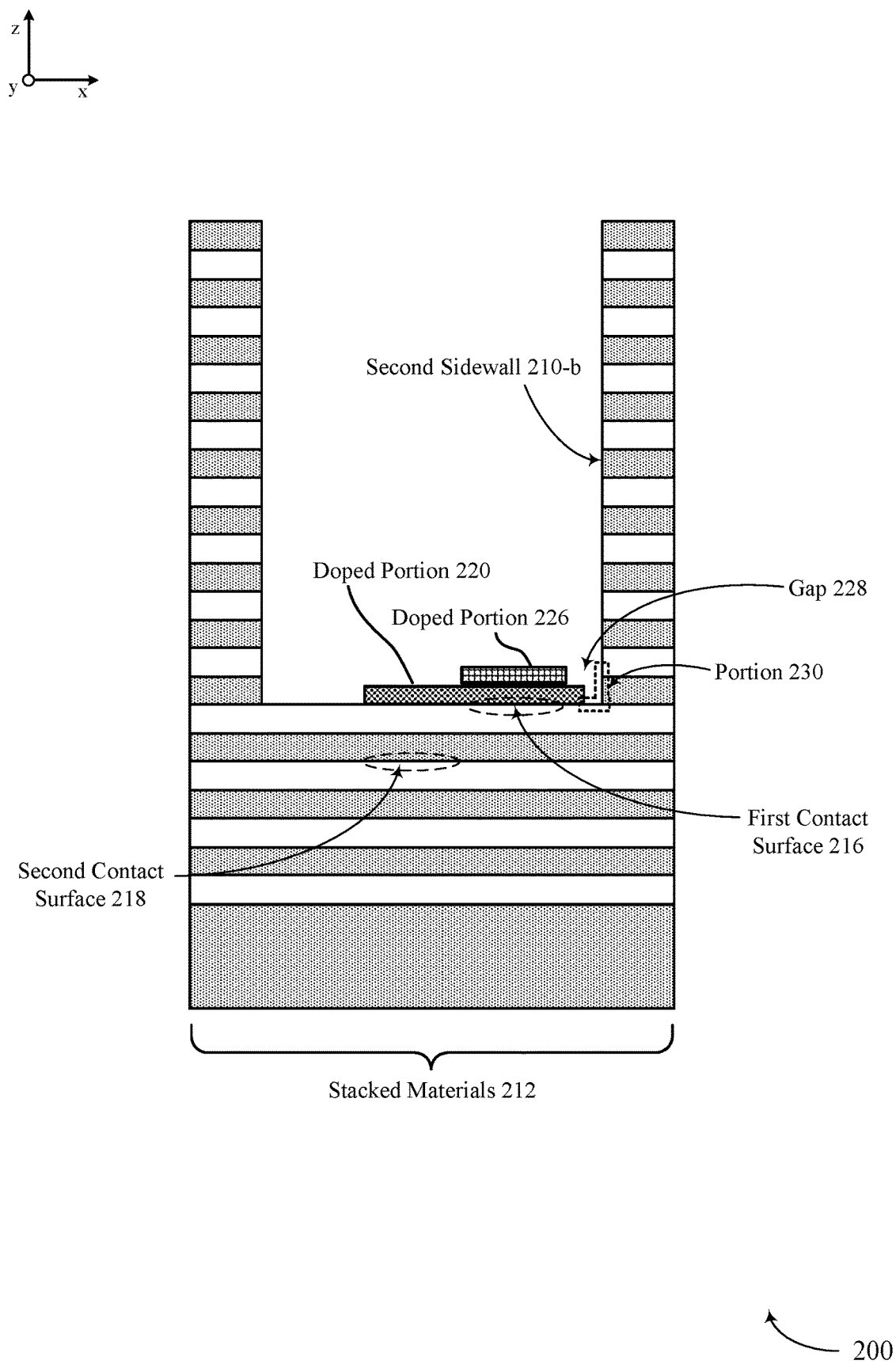
Figure 2H:
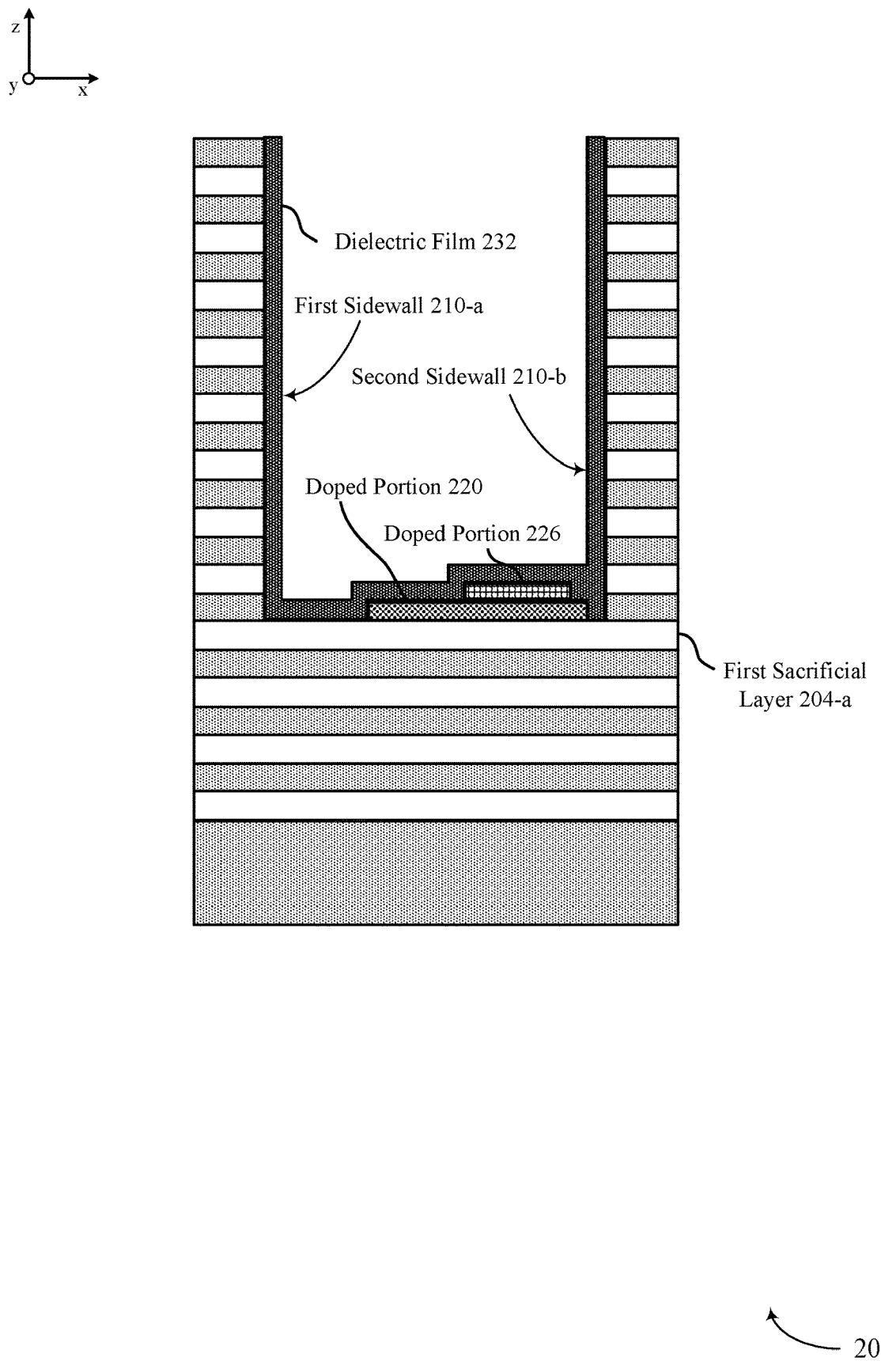
Figure 2I:
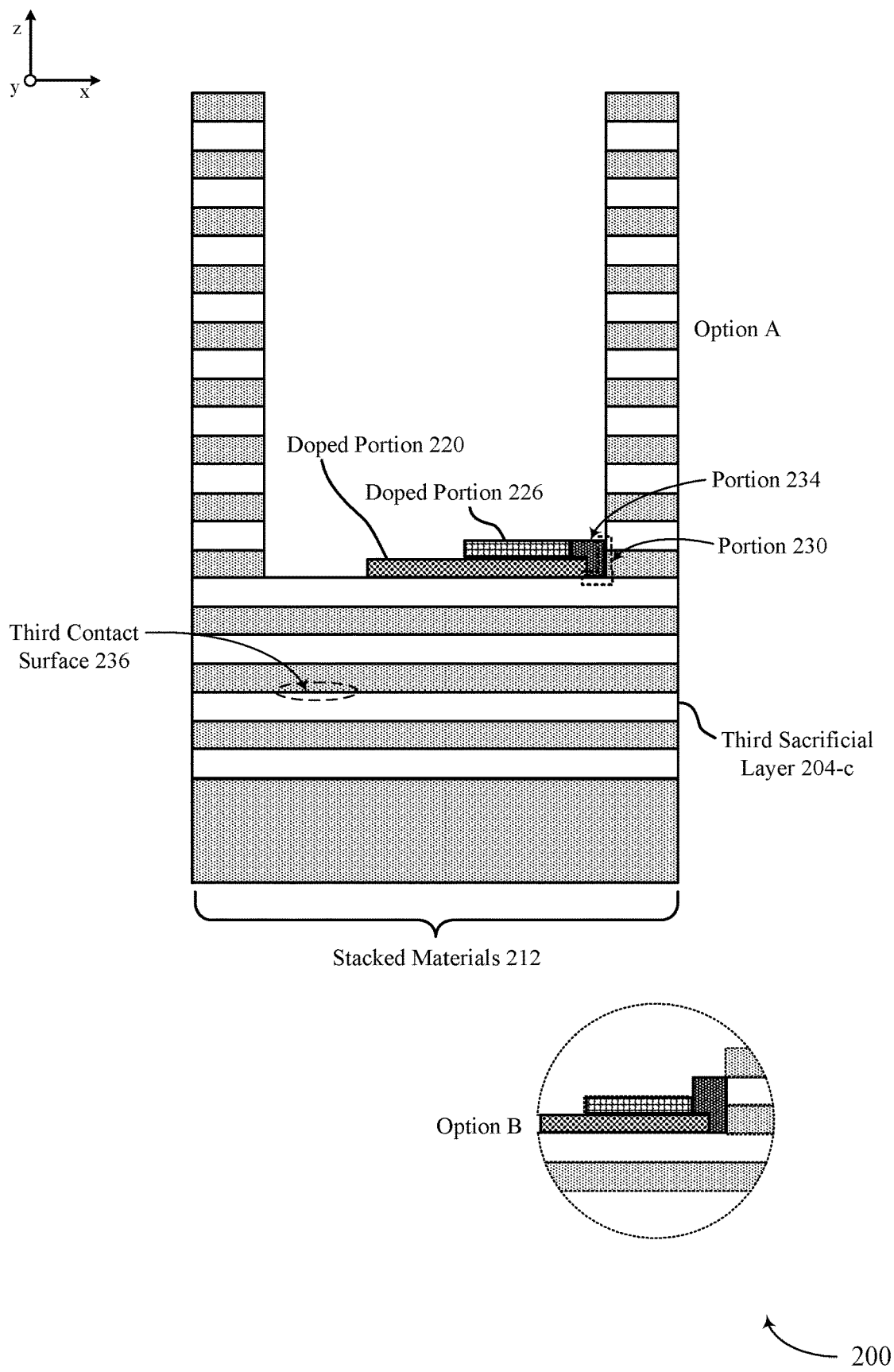
Figure 2J:
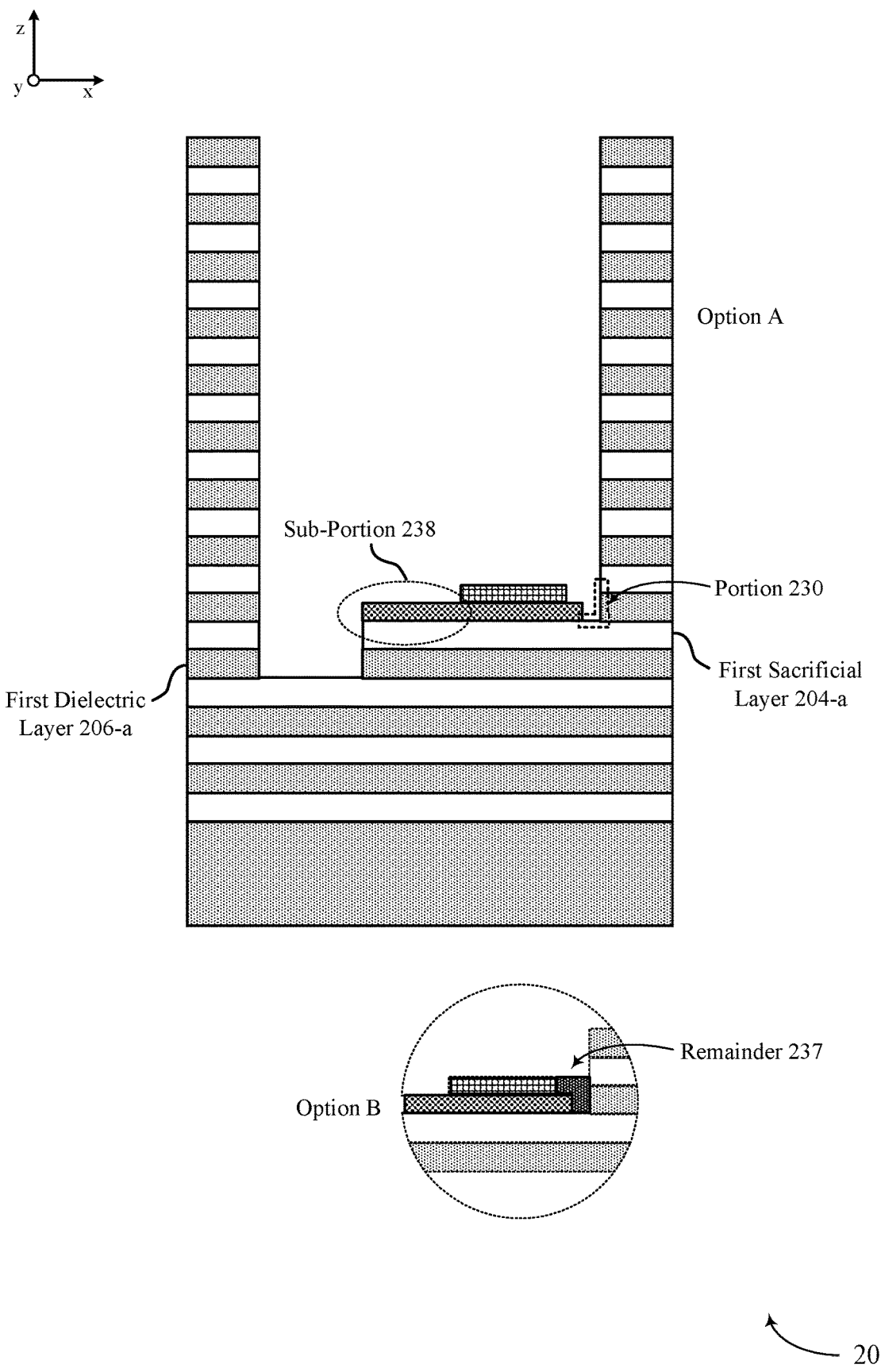
Figure 2K:
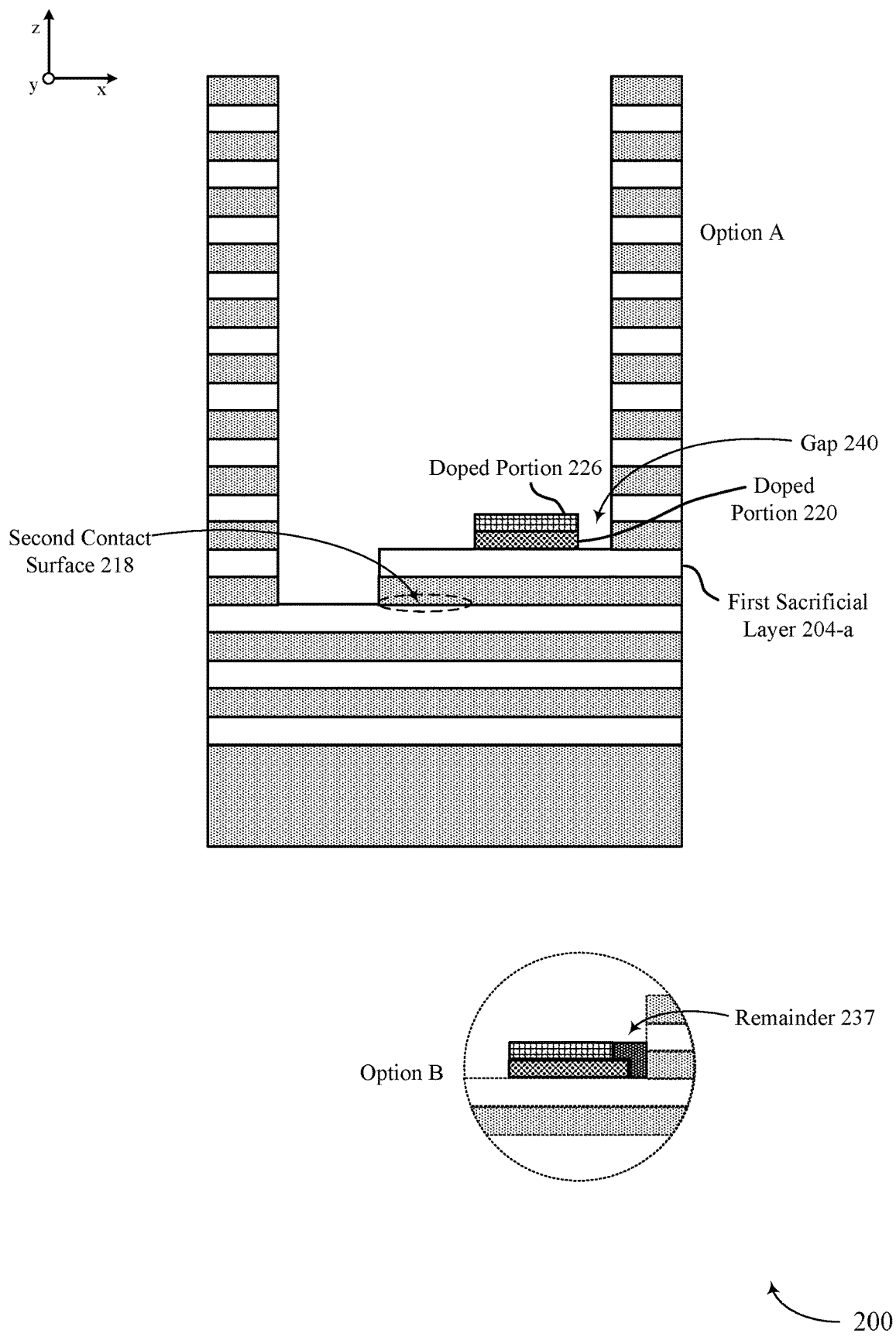
Figure 2L:
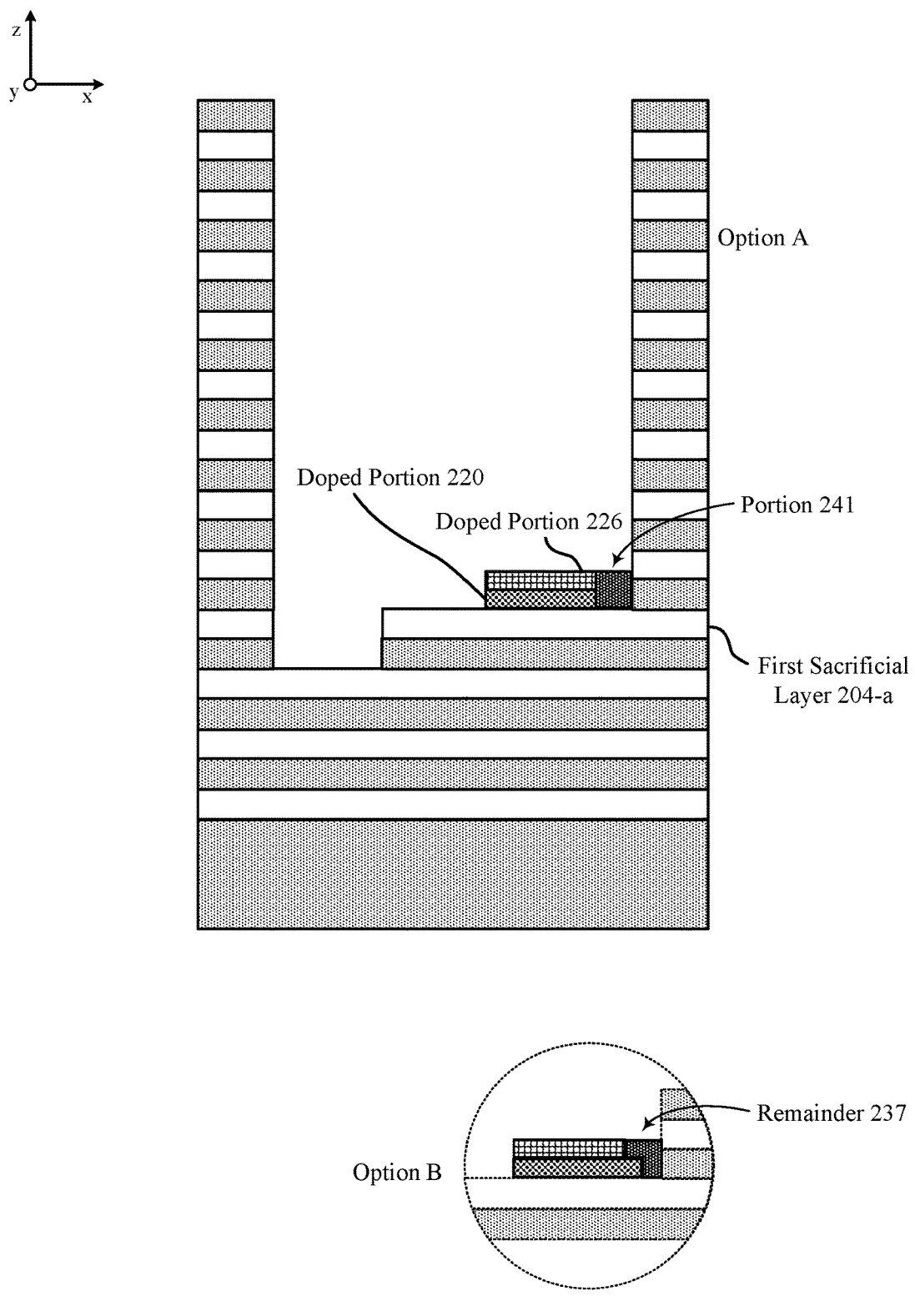
Figure 2M:
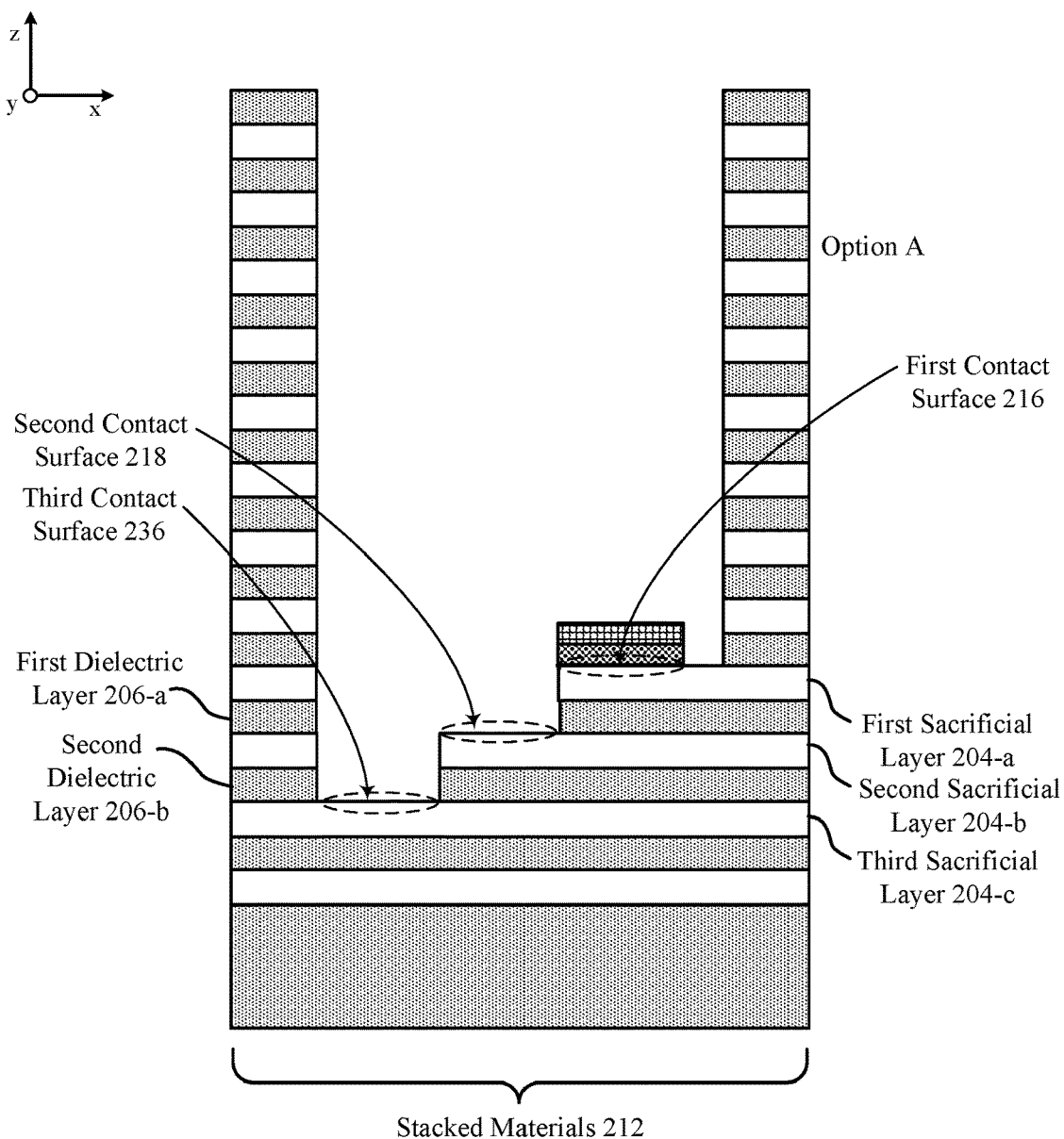
Figure 2M:
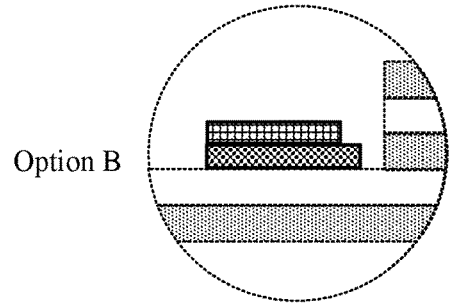
Figure 2N:
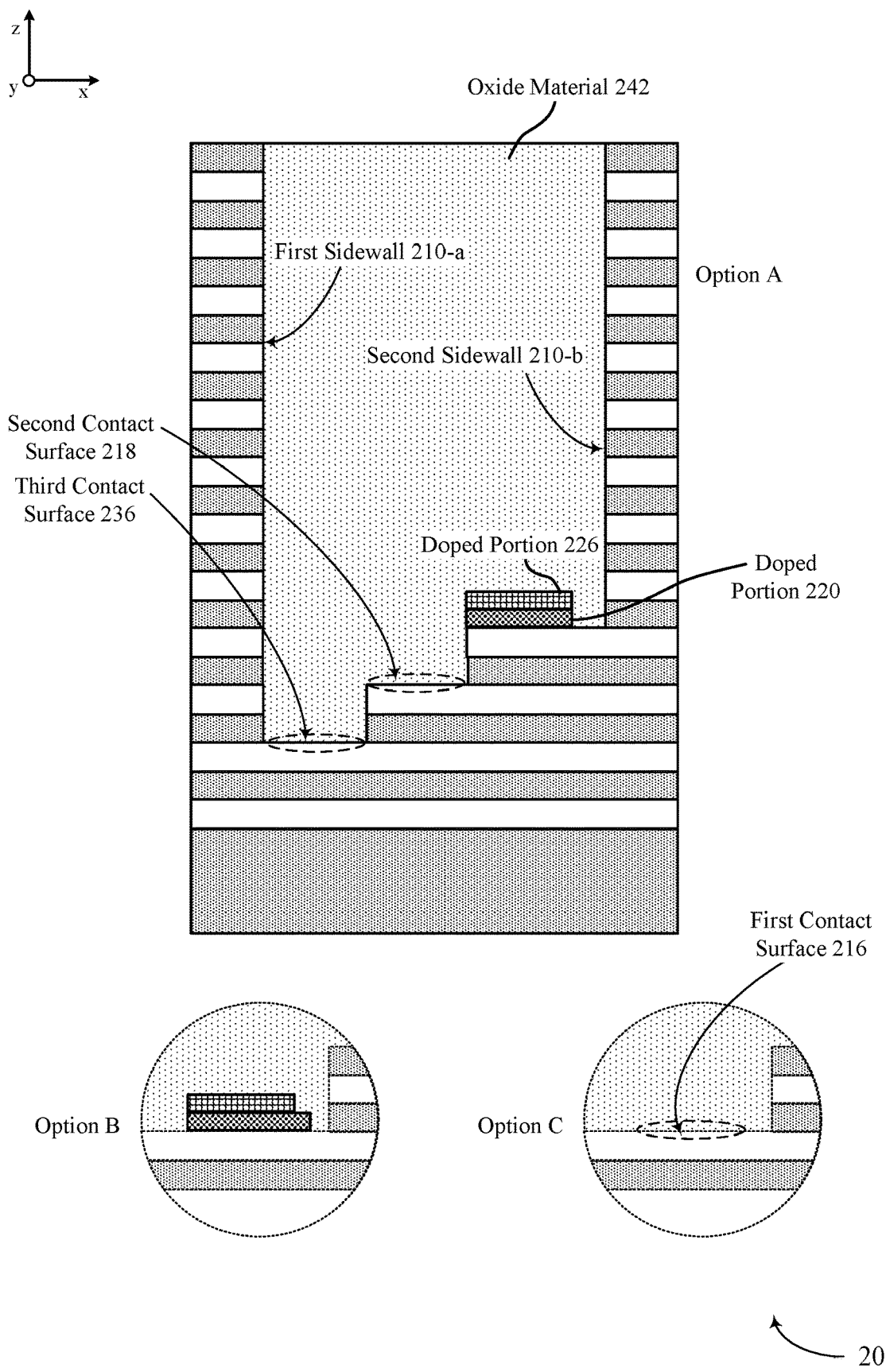
Figure 2O:
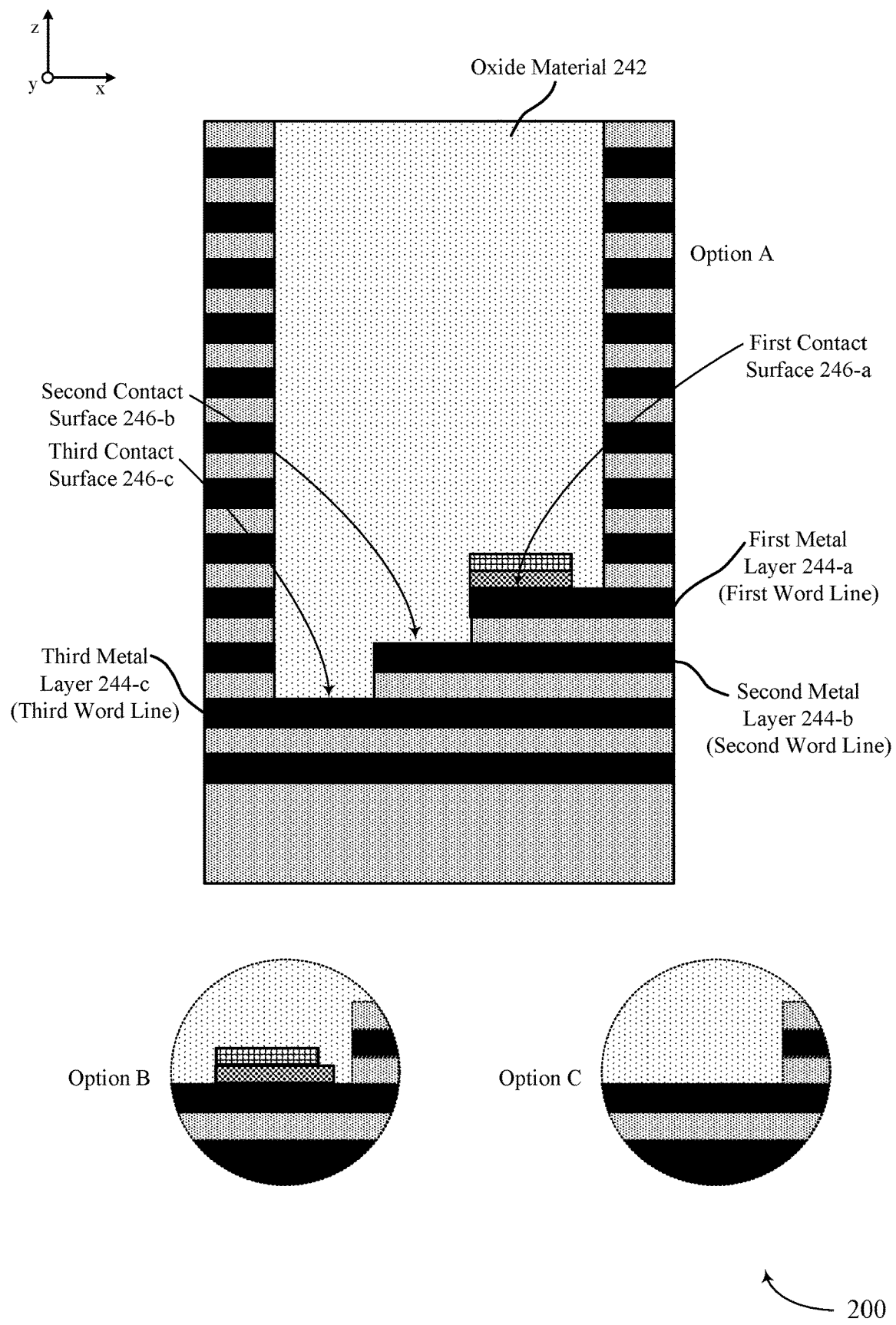
Figure 2P:
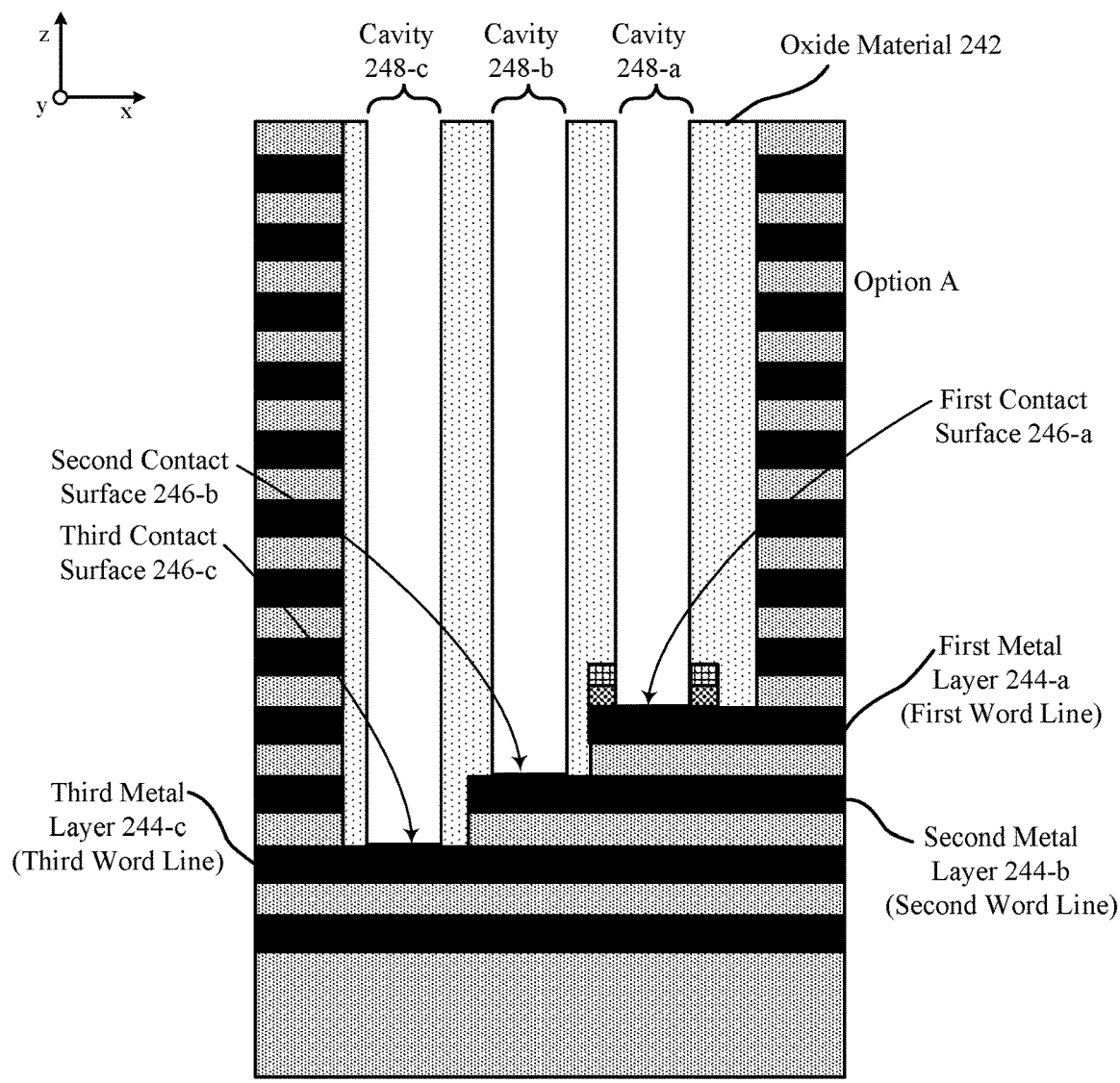
Figure 2P:
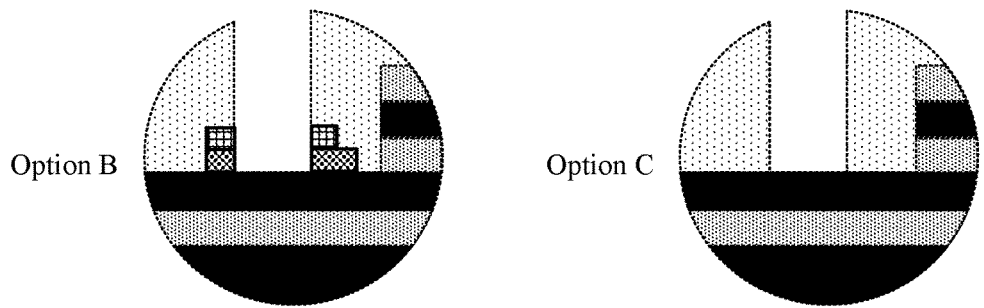
Figure 2Q:
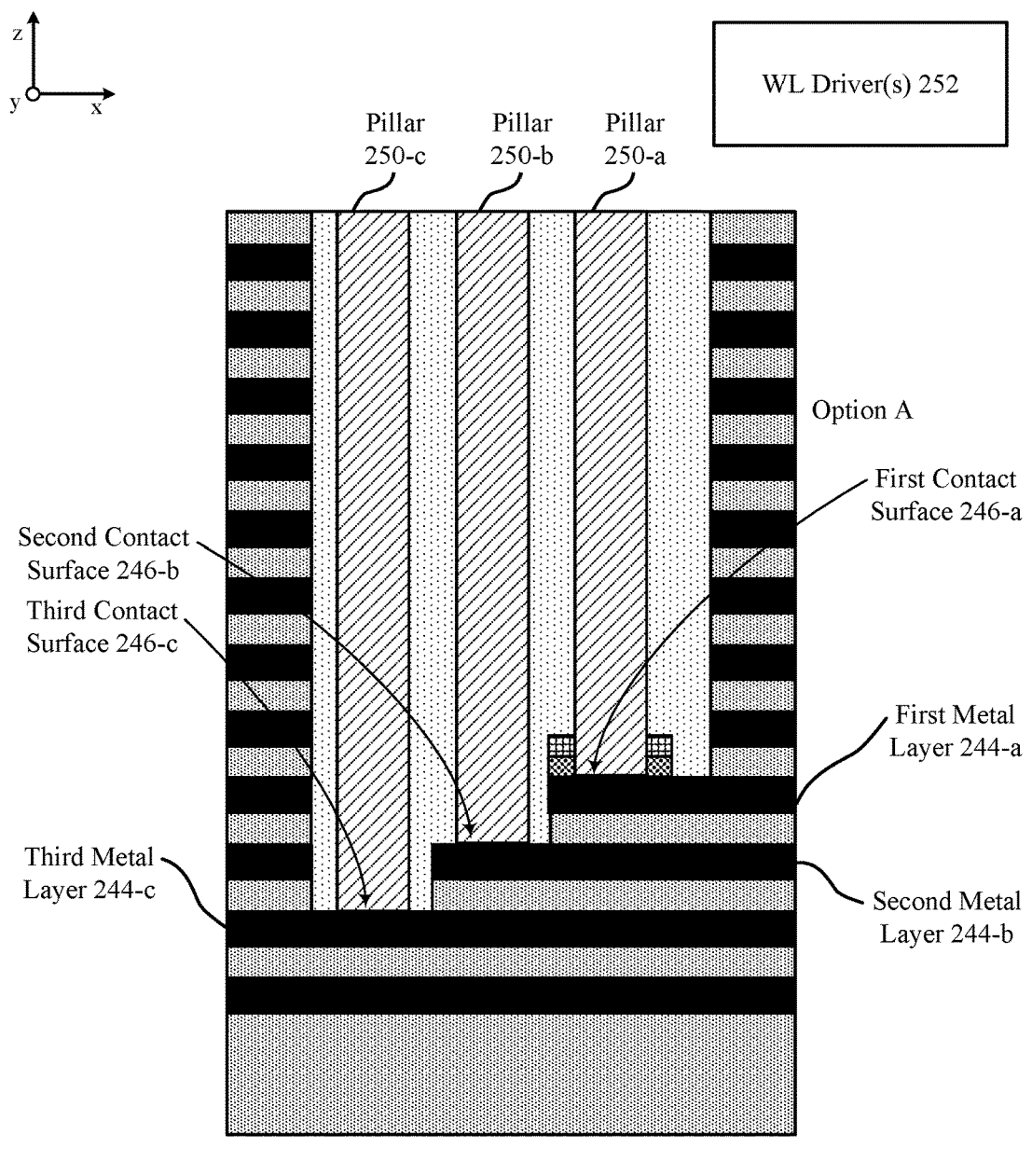
Figure 2Q:
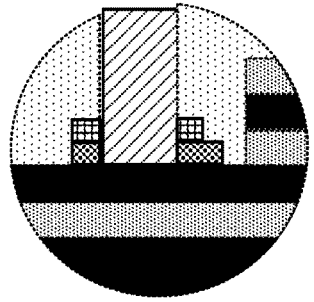
Figure 2Q:
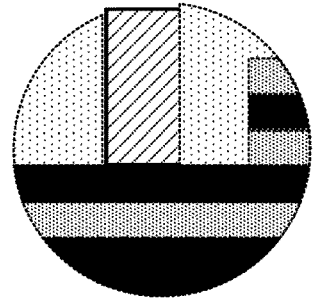

FIGS. 2A through 2Q illustrate examples of a material structure at different stages of a first process that forms multiple lateral contact surfaces in a word line staircase. In the first process, two liner materials may be deposited before some of either liner material is removed. FIGS. 2A through 2Q show a cross-section view of the material structure 200. Aspects of the material structure 200 may be described with reference to an x-direction, a y-direction, and a z-direction of the illustrated coordinate system.

FIG. 2A illustrates an example of a material structure 200 after a cavity 202 is formed in a set of stacked materials 212. The stacked materials 212 may include alternating materials (e.g., formed as layers). For examples, the stacked materials 212 may include a dielectric material (e.g., oxide) formed as dielectric layers 206 and may include a sacrificial material (e.g., nitride) formed as sacrificial layers 204. In some examples, the stacked materials 212 may be formed by depositing the dielectric material and the sacrificial material layer-by-layer. The cavity 202 may be formed by removing sections of the dielectric layers 206 and the sacrificial layers 204. A dry-etch process may be used to form the cavity 202.

The bottom or floor of the cavity 202 may be in the x-y plane and may form a tread 208 of a word line staircase as described herein. For example, the staircase may extend lengthwise in the y-direction (e.g., into the page) and may extend height-wise in the z-direction.

The cavity 202 may be at least partially bounded by a first sidewall 210-a of the stacked materials 212 and a second sidewall 210-b of the stacked materials 212, each of which may be perpendicular to the tread 208. The sacrificial material may be a placeholder material that is replaced with a metal material (e.g., that makes up the word lines) after the contact surfaces (lateral sub-treads) on the tread have been exposed. A sacrificial material may also be referred to as a placeholder material, a temporary material, or other suitable terminology.

FIG. 2B illustrates an example of the material structure 200 after a first liner material 214 is deposited in the cavity 202. In some examples, the first liner material 214 may be a polysilicon material. The first liner material 214 may overlay the tread 208, the first sidewall 210-a, and the second sidewall 210-b. Thus, the first liner material 214 may overlay the first sacrificial layer 204-a. The first liner material 214 may allow for formation of a protective barrier (e.g., etch stop) that helps protect a first contact surface 216 of the first sacrificial layer 204-a and protect materials above a second contact surface 218 of the second sacrificial layer 204-b during subsequent removal processes. A liner material may also be referred to as a mask material or other suitable terminology.

FIG. 2C illustrates an example of the material structure 200 after selectively doping a portion of the first liner material 214 to form a doped portion 220. In some examples, doping the portion of the first liner material 214 may include doping the first liner material 214 with boron. In some examples, a resist material 222-a may block some of the first liner material 214 from the doping. Thus, use of a resist material 222-a may allow for the selective doping where a portion of the first liner material 214 is doped and the rest of the first liner material 214 remains undoped. Doping the portion of the first liner material 214 may change the properties of the doped portion 220 so that the doped portion 220 is more resistant to some removal processes (e.g., wet-etching) relative to the un-doped first liner material 214. However, the doped portion 220 may be susceptible to other removal processes (e.g., dry-etching). The doped portion 220 may overlay the first contact surface 216 of the first sacrificial layer 204-a and may be above both the first contact surface 216 of the first sacrificial layer 204-a and the second contact surface 218 of the second sacrificial layer 204-b.

FIG. 2D illustrates an example of the material structure 200 after depositing a second liner material 224 within the cavity 202. In some examples, the second liner material 224 may be a nitride material. The second liner material 224 may overlay the first liner material 214. The second liner material 224 may allow for formation of a protective barrier (e.g., etch stop) that protects the first contact surface 216 of the first sacrificial layer 204-a during subsequent removal processes that expose the second contact surface 218 of the second sacrificial layer 204-b and a third contact surface 219 of a third sacrificial layer 204-c.

FIG. 2E illustrates an example of the material structure 200 after selectively doping a portion of the second liner material 224 to form a doped portion 226. In some examples, doping the portion of the second liner material 224 may include doping the second liner material 224 with carbon (e.g., implanted carbon). In some examples, a resist material 222-b may block some of the second liner material 224 from the doping. Thus, use of a resist material 222-b may allow for the selective doping where a portion of the second liner material 224 is doped and the rest of the first liner material 214 remains undoped. Doping the portion of the second liner material 224 may change the properties of the doped portion 226 so that the doped portion 226 is more resistant to some removal processes (e.g., wet-etching) relative to the un-doped second liner material 224. However, the doped portion 226 may be susceptible to other removal processes (e.g., dry-etching). The doped portion 226 may overlay the doped portion 220 and may be above the first contact surface 216 of the first sacrificial layer 204-a.

FIG. 2F illustrates an example of the material structure 200 after removing some of the second liner material 224 and leaving the doped portion 226. In some examples, a wet-etching process may be used to remove some of the second liner material 224. Removal of some of the second liner material 224 may allow for the second and third contact surfaces to be exposed in subsequent removal processes. Retention of the doped portion 226 may help protect the first contact surface 216 from exposure or removal during subsequent removal processes. In some examples, removing some of the second liner material 224 may form a gap 228 that is between the doped portion 220, the doped portion 226, and the second sidewall 210-b. The width of the gap (e.g., in the x-direction) may be based on (e.g., similar to, equal to) the thickness (e.g., in the x-direction) of the second liner material 224.

FIG. 2G illustrates an example of the material structure 200 after removing some of the first liner material 214 and leaving the doped portion 220 (as well as the doped portion 226). In some examples, a wet-etching process may be used to remove some of the first liner material 214. Removal of some of the first liner material 214 may allow for the second and third contact surfaces to be exposed in subsequent removal processes. Retention of the doped portion 220 may help protect the first contact surface 216 and the second contact surface 218 from exposure or removal during subsequent removal processes.

In some examples, removing some of the first liner material 214 may expose a portion 230 of the stacked materials 212. In some examples, removing some of the first liner material 214 may widen the gap 228 that is between the doped portion 220, the doped portion 226, and the second sidewall 210-b. The width of the gap (e.g., in the x-direction) may vary in the y-direction. For example, a lower portion of the gap 228 may have a width based on (e.g., equal to) the thickness (e.g., in the x-direction) of the second liner material 224 whereas an upper portion of the gap 228 may have a width based on (e.g., equal to the sum of) the thickness of the second liner material 224 and the thickness of the first liner material 214. That is, the upper portion of the gap 228 may be wider than the lower portion of the gap 228.

FIG. 2H illustrates an example of the material structure 200 after depositing a gap fill material, such as dielectric film 232, within the cavity 302. In some examples, the dielectric film 322 is an oxide material. After depositing the dielectric film 232, the dielectric film 232 may overlay one or more of the first sidewall 210-a, the second sidewall 210-b, the first sacrificial layer 204-a, the doped portion 230, and the doped portion 226. So, addition of the dielectric film 232 may fill the gap 228. The dielectric film 232 may protect the stack of materials from future removal steps and promote electrical isolation of word line contacts.

FIG. 2I illustrates an example of the material structure 200 after removing some of the dielectric film 232 and leaving a portion 234 of the dielectric film 232. In some examples, a wet-etching process may be used to remove some of the dielectric film 232. Removing some of the dielectric film 232 may allow for removal of materials above a third contact surface 236 of a third sacrificial layer 204-c. Retaining the portion 234 may protect a portion of the stacked materials 212 (e.g., portion 230) against removal. In one option (referred to as Option A), the dielectric film 232 may be removed such that the top of portion 234 is flush with the top of the doped portion 226. In another example (referred to as Option B), the top of the portion 234 may be higher than the top of the doped portion 226 (as shown in the dashed circle) so that the same portion 234 can be used to protect against multiple removal processes.

FIG. 2J illustrates an example of the material structure 200 after removing a section of the first sacrificial layer 204-*a* and a section of dielectric layer 206-*a* that is below the first sacrificial layer 204-*a*. In some examples, a wet-etching process may be used to remove the sections of first sacrificial layer 204-*a* and the dielectric layer 206-*a*. The doped portion 220 and the doped portion 226 may protect a section of the stacked materials 212 from the wet-etch process, which may be isotropic.

In Option A, the removal process may also remove the portion 234 of the dielectric film 232, thereby re-exposing the portion 230 of the stacked materials 212. In Option B, the removal process may remove some of the portion 234 and may leave behind a remainder 237 of the portion 234 of the dielectric film 232 to protect the portion 230 against the next removal process.

FIG. 2K illustrates an example of the material structure 200 after cutting back the doped portion 220. For example, one or more sub-portions (including sub-portion 238 in FIG. 2J) may be removed from the doped portion 220 of the first liner material 214 so that one or more ends of the doped portion 220 align (e.g., in the x-direction) with one or more ends of the doped portion 226. Removing the sub-portion 238 may expose a section of the first sacrificial layer 204-*a* that is above the second contact surface 218 (so that the second contact surface 218 can be exposed during a subsequent removal process).

In Option A, after removal of the sub-portion 238 (and another sub-portion) the material structure 200 may include a stack of the doped portion 220 and the doped portion 226, where the sidewalls of the doped portions are aligned. In Option B, after removal of the sub-portion 238 the material structure 200 may include a stack of the doped portion 220 and the doped portion 226, where the left sidewalls of the doped portions are aligned and the right sidewall of the doped portion 226 extends past (e.g., in the x-direction) the right sidewall of the doped portion 220.

FIG. 2L illustrates an example of the material structure 200 after a portion 241 of a gap fill material, such as a dielectric material, is formed (e.g., in Option A). The portion 241 may be formed using a technique similar to that described with reference to FIGS. 2H and 2I. For example, a dielectric film may be deposited in the cavity so that the dielectric film overlays one or more of the first sidewall 210-*a*, the second sidewall 210-*b*, the first sacrificial layer 204-*a*, the doped portion 230, and the doped portion 226. So, addition of the dielectric film may fill the gap 240 exposed by the removal process used to remove the sections of the first sacrificial layer 204-*a* and the first dielectric layer 206-*a*. After depositing the dielectric film, some of the dielectric film may be removed and the portion 241 may be retained so that the first sacrificial layer 204-*a* is protected against a subsequent removal process.

In Option B, the formation of portion 241 may be avoided (e.g., not performed) because the remainder 237 of the dielectric film 232 is still available to protect against a subsequent removal process.

FIG. 2M illustrates an example of the material structure 200 after removing sections of the stacked materials (e.g., sections of the first sacrificial layer 204-*a*, the first dielectric layer 206-*a*, the second sacrificial layer 204-*b*, and the second dielectric layer 206-*b*). In some examples, a wet-etching process may be used to remove the sections of the stacked materials 212. The first contact surface 246-*a* may be protected against removal by the doped portion 220 and the doped portion 226. Removing the sections of the stacked materials 212 may expose the second contact surface 218 and the third contact surface 236. The removal process used to remove the sections of the stacked materials 212 may also remove the portion 241 of the dielectric film (in Option A) or the remainder 237 of the dielectric film 232 (in Option B).

FIG. 2N illustrates an example of the material structure 200 after depositing an oxide material 242 within the cavity 202. The oxide material 242 may be deposited so that the oxide material 242 fills the cavity 202 and overlays the first sidewall 210-*a*, the second sidewall 210-*b*, the second contact surface 218, the third contact surface 236, and the stack of the doped portion 220 and the doped portion 226. The oxide material 242 may be deposited to allow for the formation of conductive pillars (e.g., word line contacts) within the material structure 200, among other purposes.

In some examples (e.g., in Option C), the stack of the doped portion 220 and the doped portion 226 may be removed before depositing the oxide material 242. In such examples, the oxide material may be deposited so that the oxide material 242 fills the cavity 202 and overlays the first sidewall 210-*a*, the second sidewall 210-*b*, the first contact surface 246-*a*, the second contact surface 218, the third contact surface 236.

FIG. 2O illustrates an example of the material structure 200 after replacing the sacrificial material with a metal material. For example, the first sacrificial layer 204-*a* may be replaced by a first metal layer 244-*a* that forms a first word line coupled with a first memory cell. Similarly, the second sacrificial layer 204-*b* may be replaced by a second metal layer 244-*b* that forms a second word line coupled with a second memory cell. And the third sacrificial layer 204-*c* may be replaced by a third metal layer 244-*c* that forms a third word line coupled with a third memory cell. Thus, the material structure 200 may include a first contact surface 246-*a* of the first metal layer 244-*a*, a second contact surface 246-*b* of the second metal layer 244-*b*, and a third contact surface 246-*c* of the third metal layer 244-*c*. In some examples, the replacement process may be referred to as a replacement gate (RG) process.

FIG. 2P illustrates an example of the material structure 200 after forming elongated cavities, such as cavity 248-*a*, cavity 248-*b*, and cavity 248-*c*, in the material structure 200. In some examples, a dry-etching process (which may be anisotropic) may be used to form the cavities. The cavities 248 may be formed through the oxide material 242. Additionally (e.g., in Option A, in Option B), the cavity 248-*a* may be formed through the stack of the doped portion 220 and the doped portion 226.

The metal layers 244 may act as etch stops so that the cavities stop at the metal layers 244. However, the doped portion 220 and the doped portion 226 may be susceptible to dry-etching, so the cavity 248-*a* may extend through the doped portion 220 and the doped portion 226 to the first metal layer 244-*a*. So, forming the cavities 248 may expose the first contact surface 246-*a*, the second contact surface 246-*b*, and the third contact surface 246-*c*.

FIG. 2Q illustrates an example of the material structure 200 after forming conductive (e.g., metal) pillars, such as pillar 250-*a*, pillar 250-*b*, and pillar 250-*c*, within the elongated cavities 248. For example, pillar 250-*a* may be formed within cavity 248-*a*, pillar 250-*b* may be formed within the cavity 248-*b*, and pillar 250-*c* may be formed within the cavity 248-*c*.

Pillar 250-*a* may be a first word line contact above the first contact surface 246-*a* of the first metal layer 244-*a* (the first word line) and may be coupled with or even contact the first contact surface 246-*a*. In some examples, pillar 250-*a* may be coupled with a word line driver 252 or other component that is configured to apply electrical signals to the first word line via the pillar 250-*a*.

Pillar 250-*b* may be a second word line contact above the second contact surface 246-*b* of the second metal layer 244-*b* (the second word line) and may be coupled with or even contact the second contact surface 246-*b*. In some examples, pillar 250-*b* may be coupled with a word line driver 252 or other component that is configured to apply electrical signals to the second word line via the pillar 250-*b*.

Pillar 250-*c* may be a third word line contact above the third contact surface 246-*a* of the third metal layer 244-*c* (the third word line) and may be coupled with or even contact the third contact surface 246-*c*. In some examples, pillar 250-*c* may be coupled with a word line driver 252 or other component that is configured to apply electrical signals to the third word line via the pillar 250-*c*.

In Option A and Option B, the pillar 250-*a* may be disposed at least partially through the stack of the doped portion 220 and the doped portion 226. Put another way, the stack of the doped portion 220 and the doped portion 226 may at least partially surround an end of the pillar 250-*a*. The oxide material 242 may separate the second sidewall 210-*b* from pillar 250-*a* and the stack of the doped portion 220 and the doped portion 226.

Thus, the material structure 200 may include three word line contact surfaces 246 (lateral sub-treads), which may reduce the area consumed by the word line contacts (pillars 250).

Figure 3A:
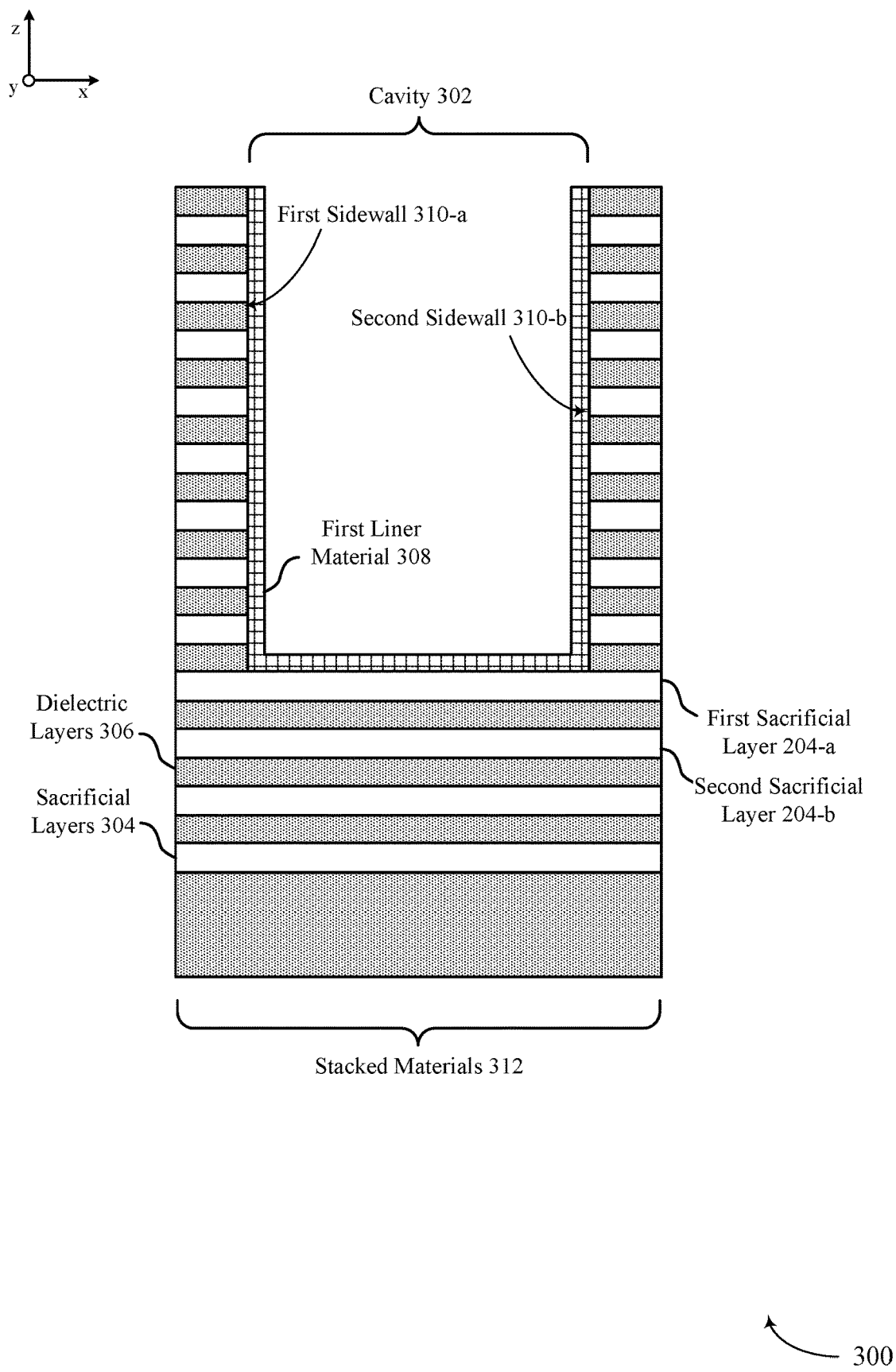
FIGS. 3A through 3N illustrate an example of a material structure that supports staircase formation in a memory array in accordance with examples as disclosed herein.
Figure 3B:
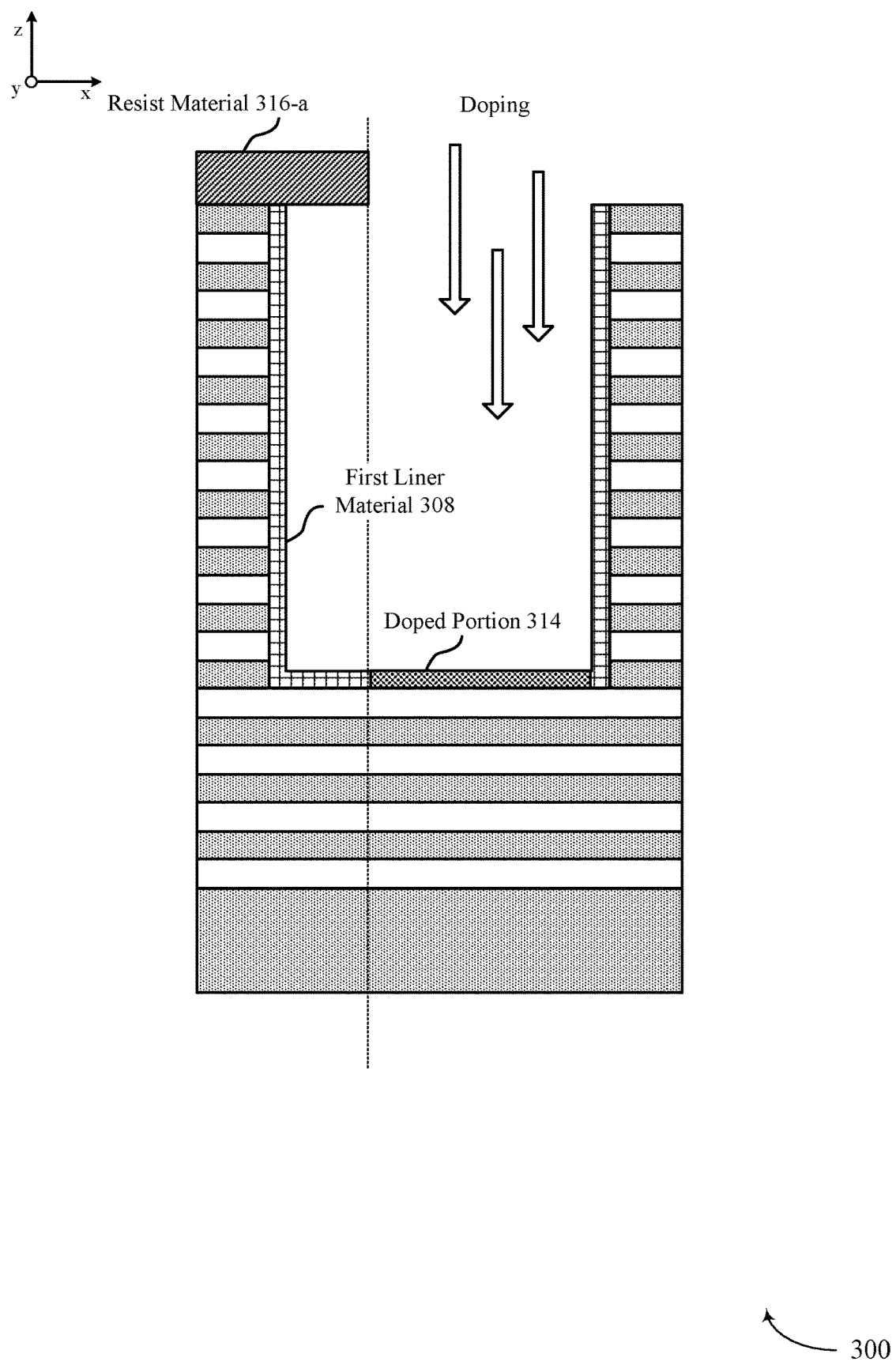
Figure 3C:
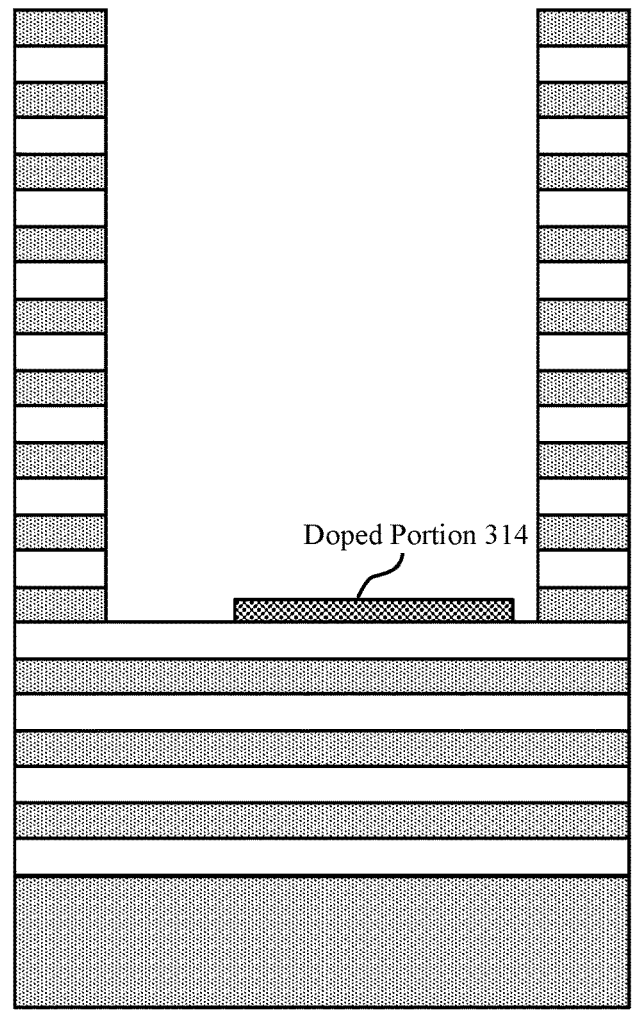
Figure 3D:
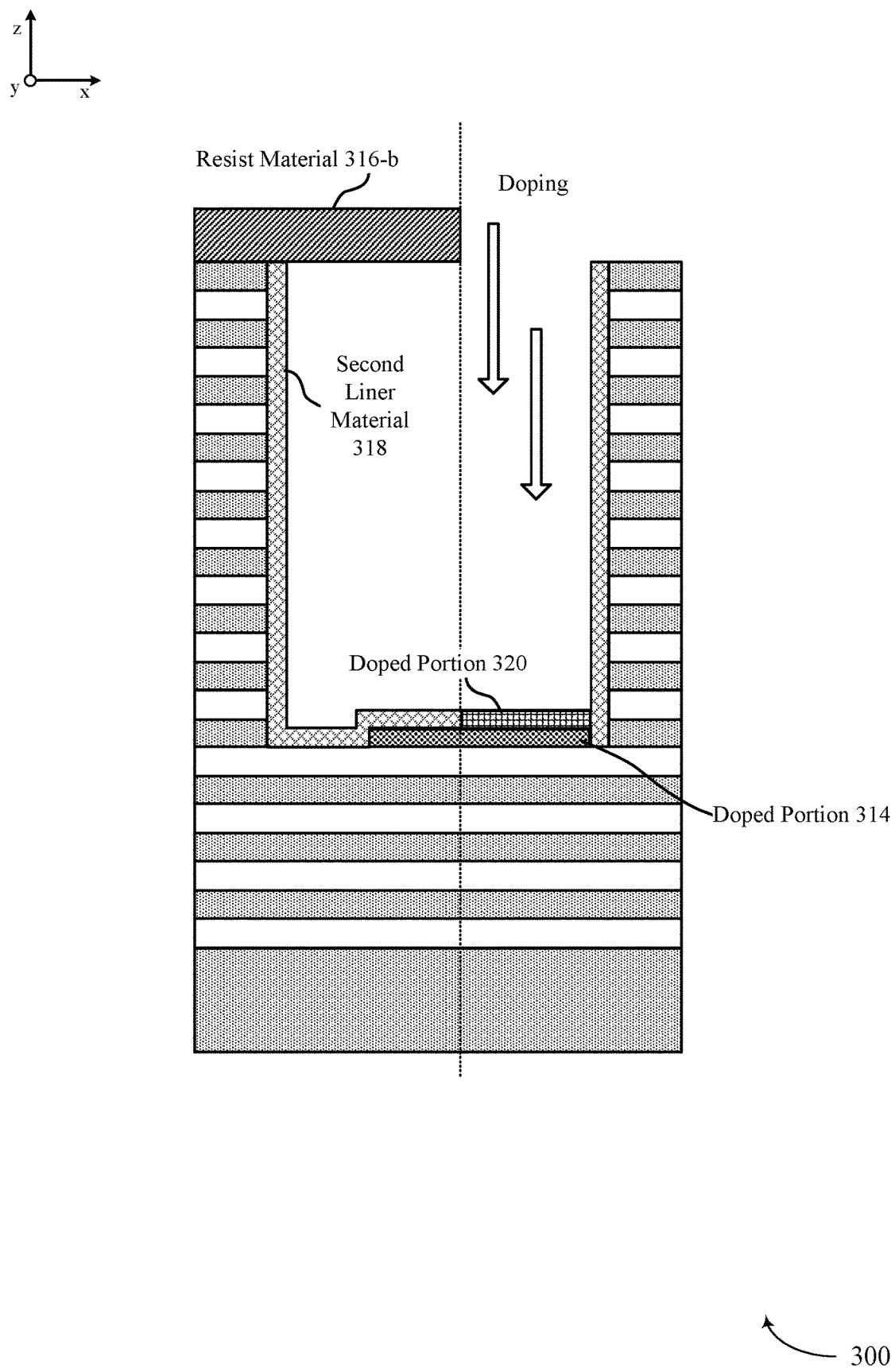
Figure 3E:
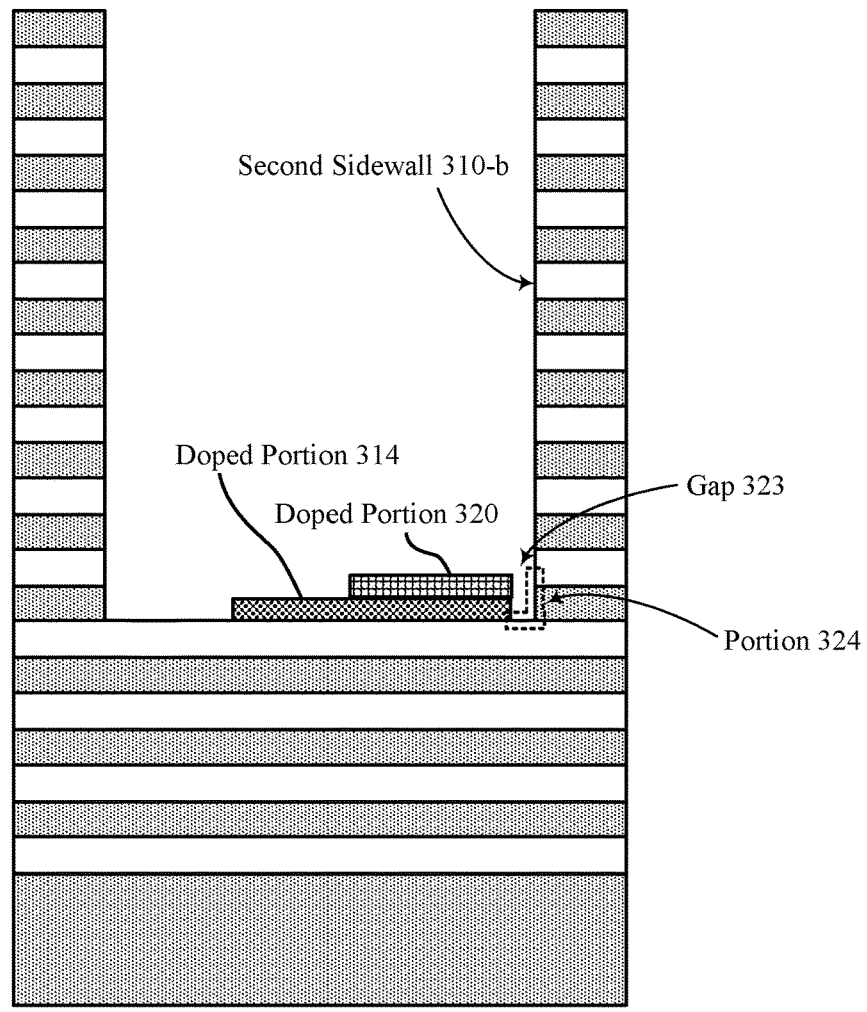
Figure 3F:
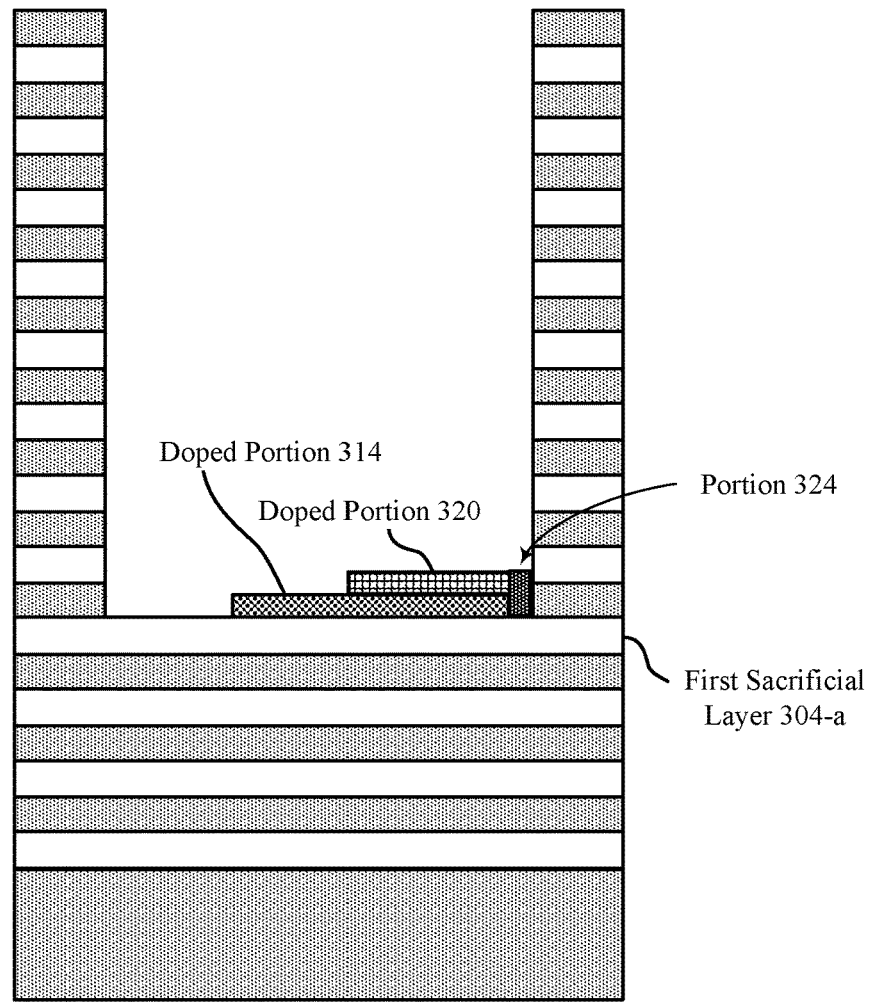
Figure 3G:
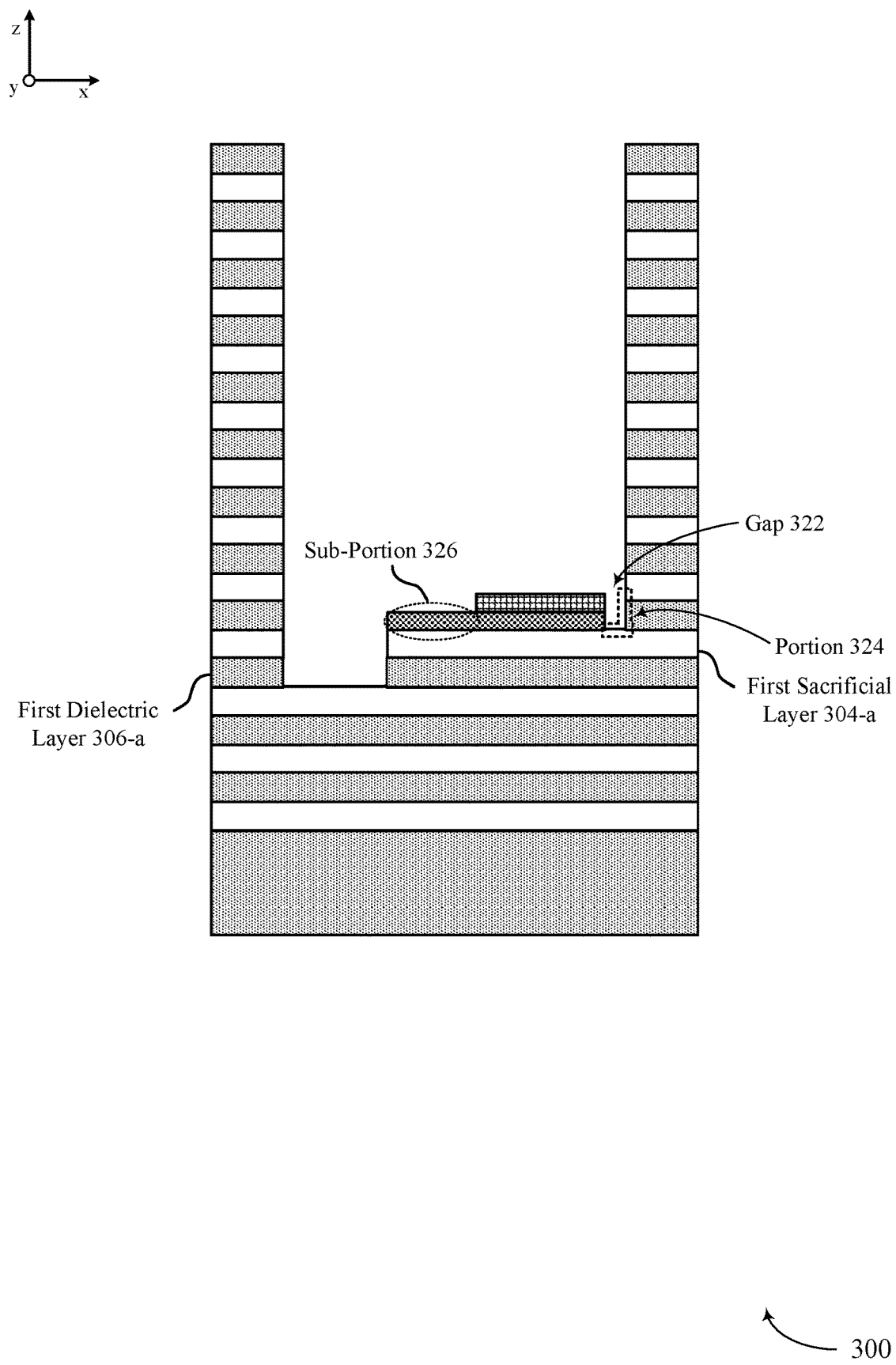
Figure 3H:
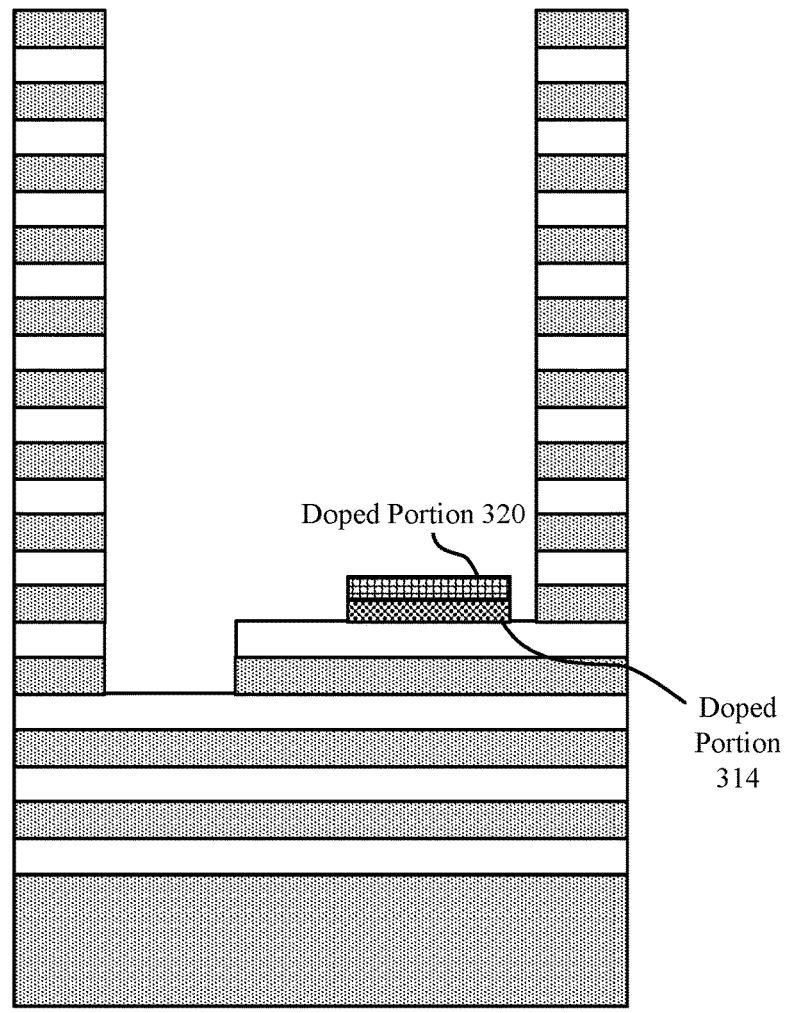
Figure 3I:
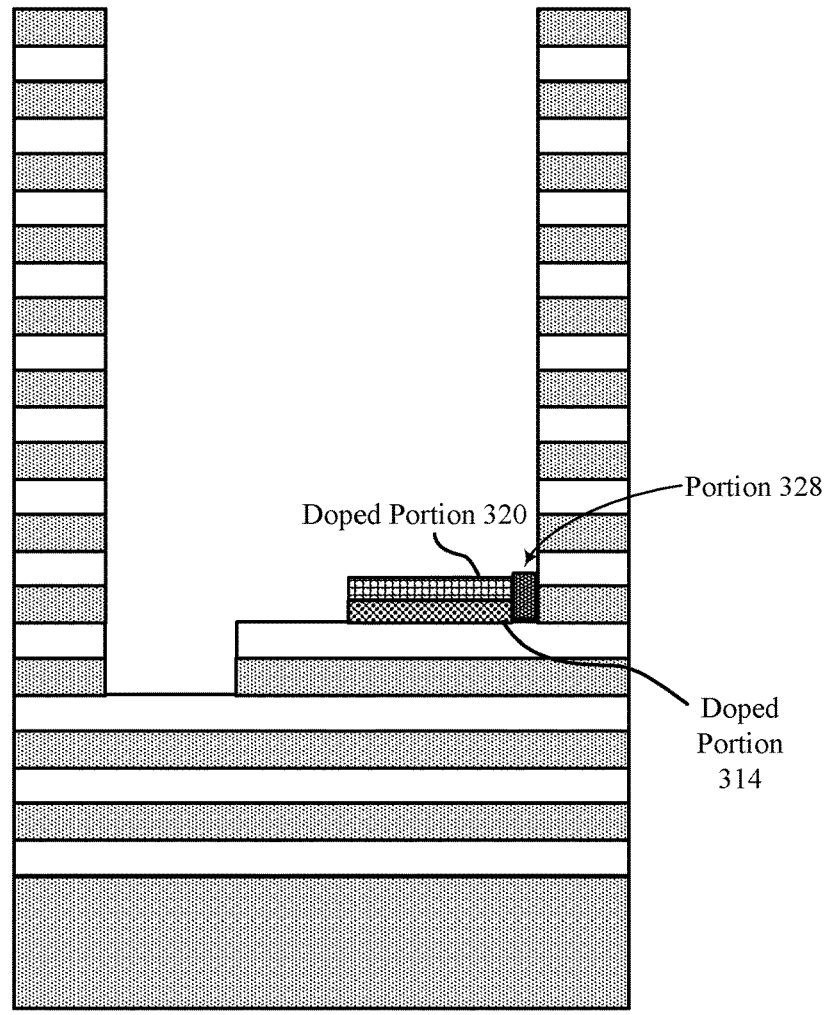
Figure 3J:
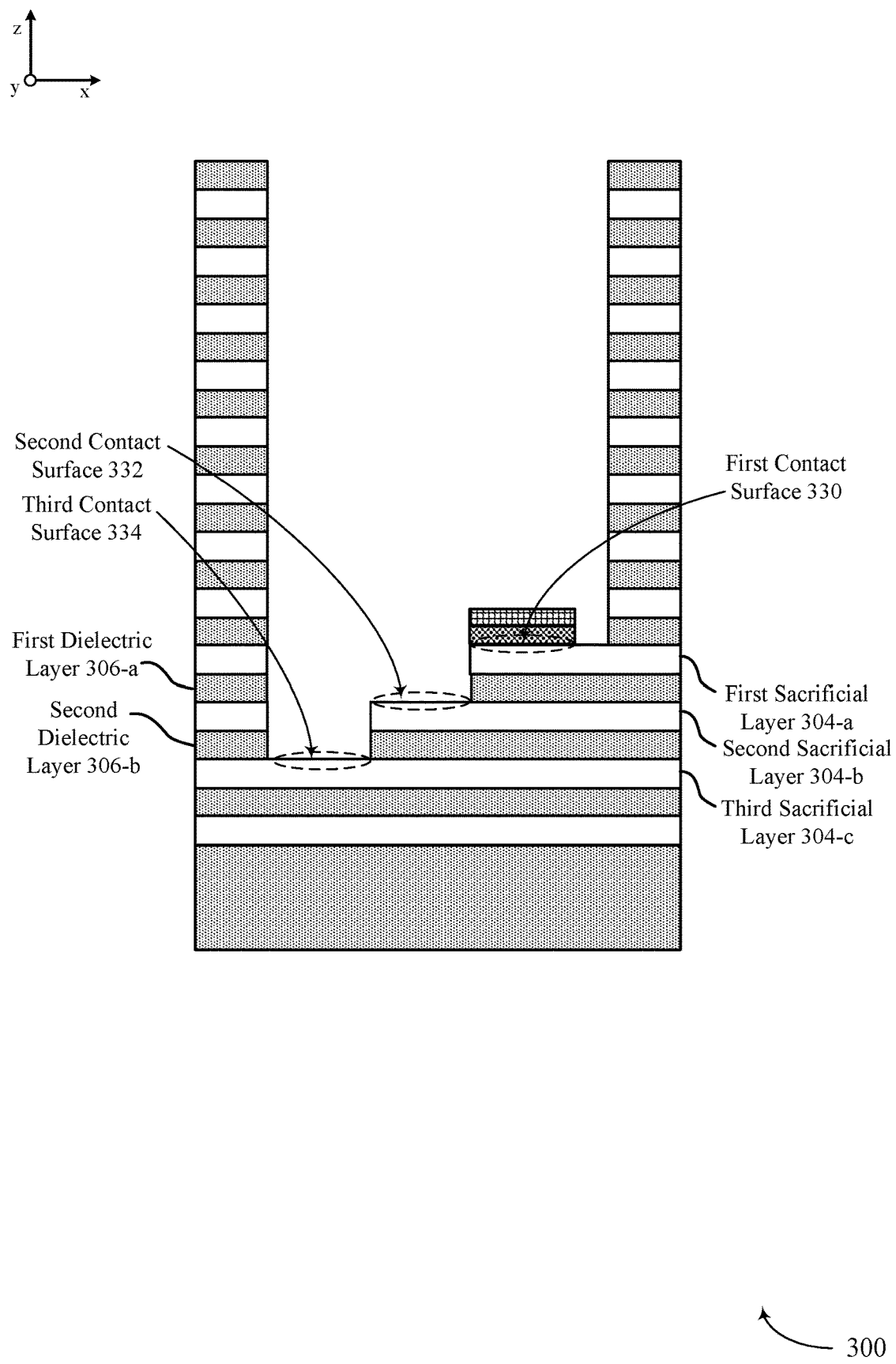
Figure 3K:
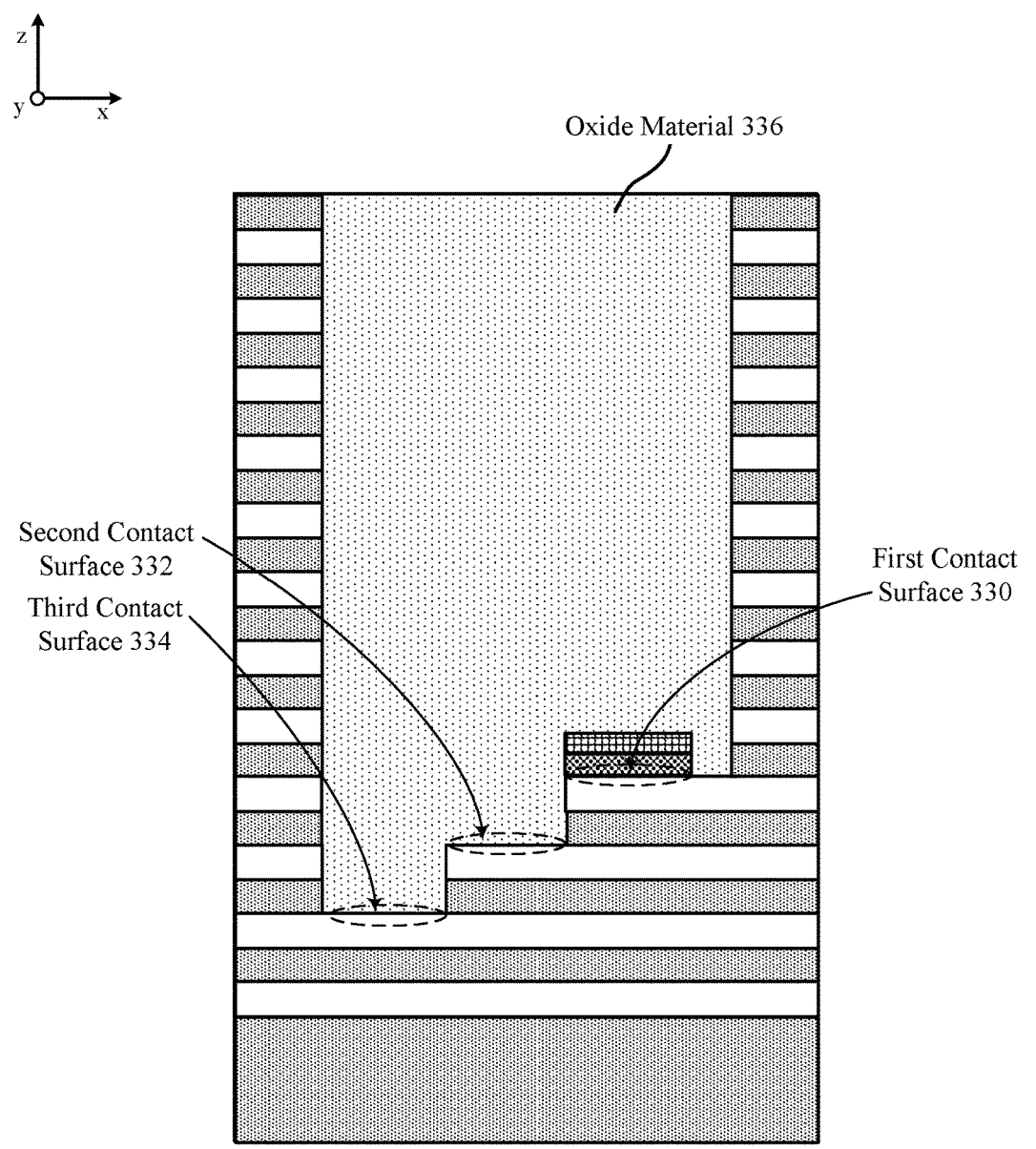
Figure 3L:
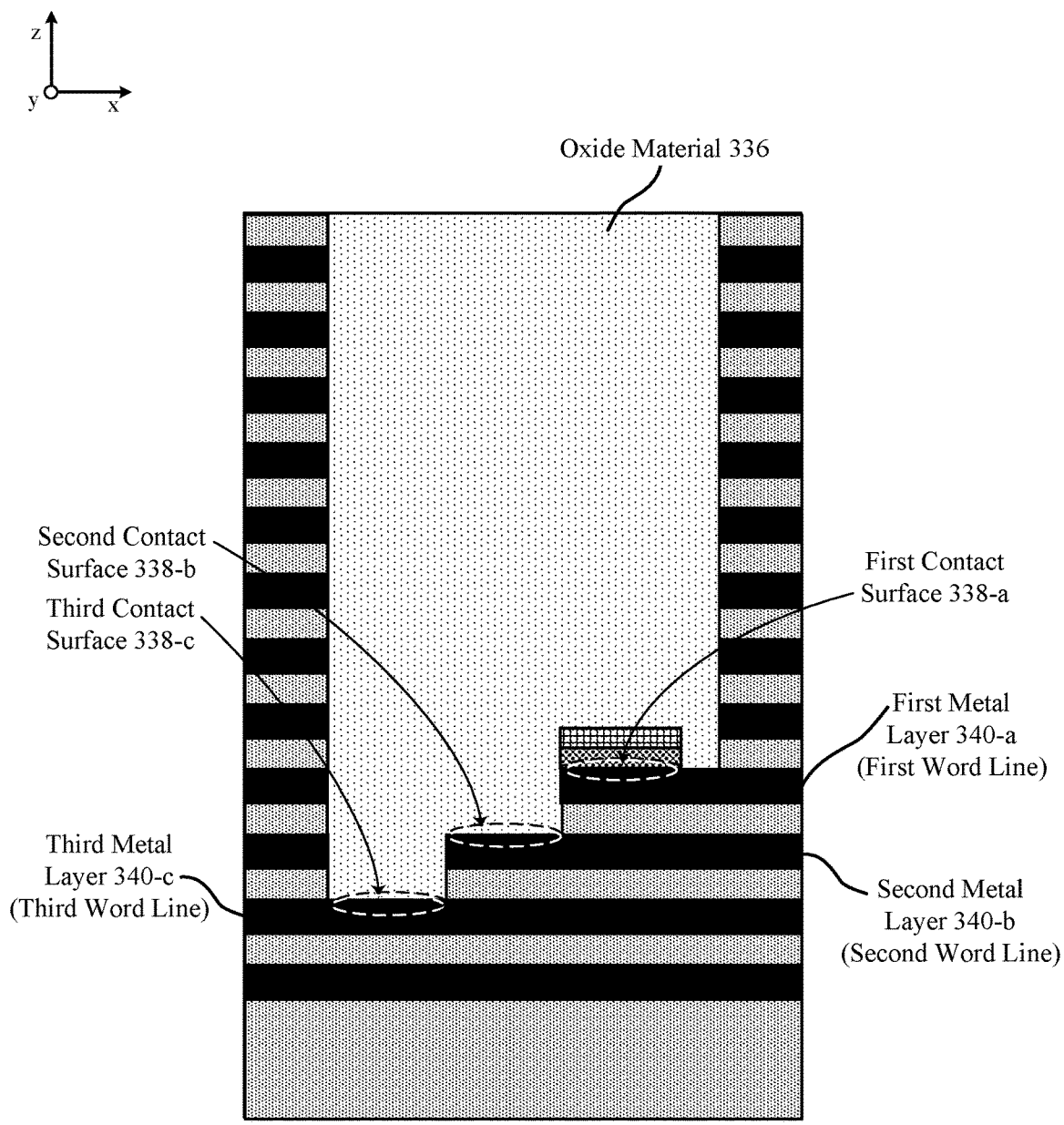
Figure 3M:
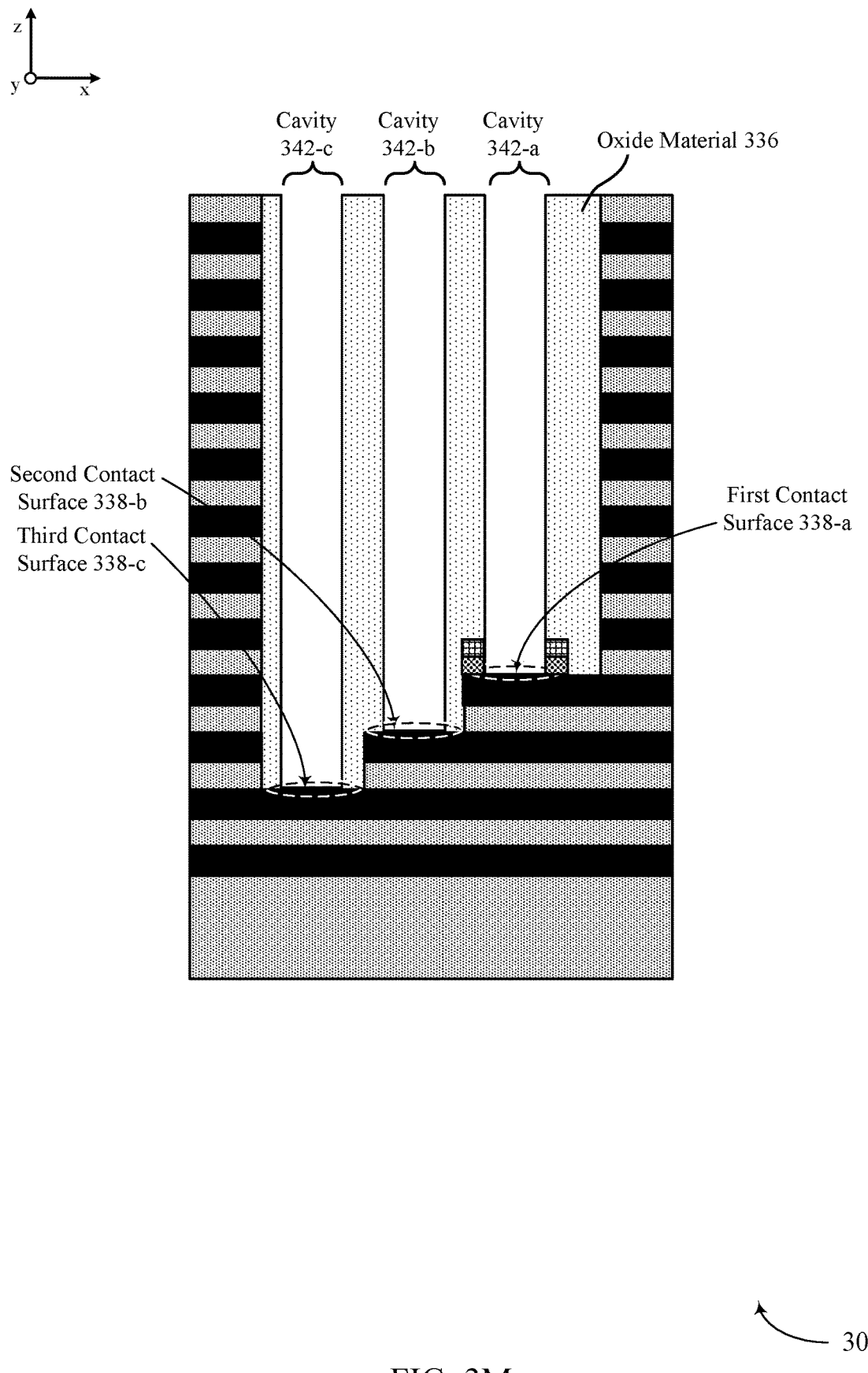
Figure 3N:
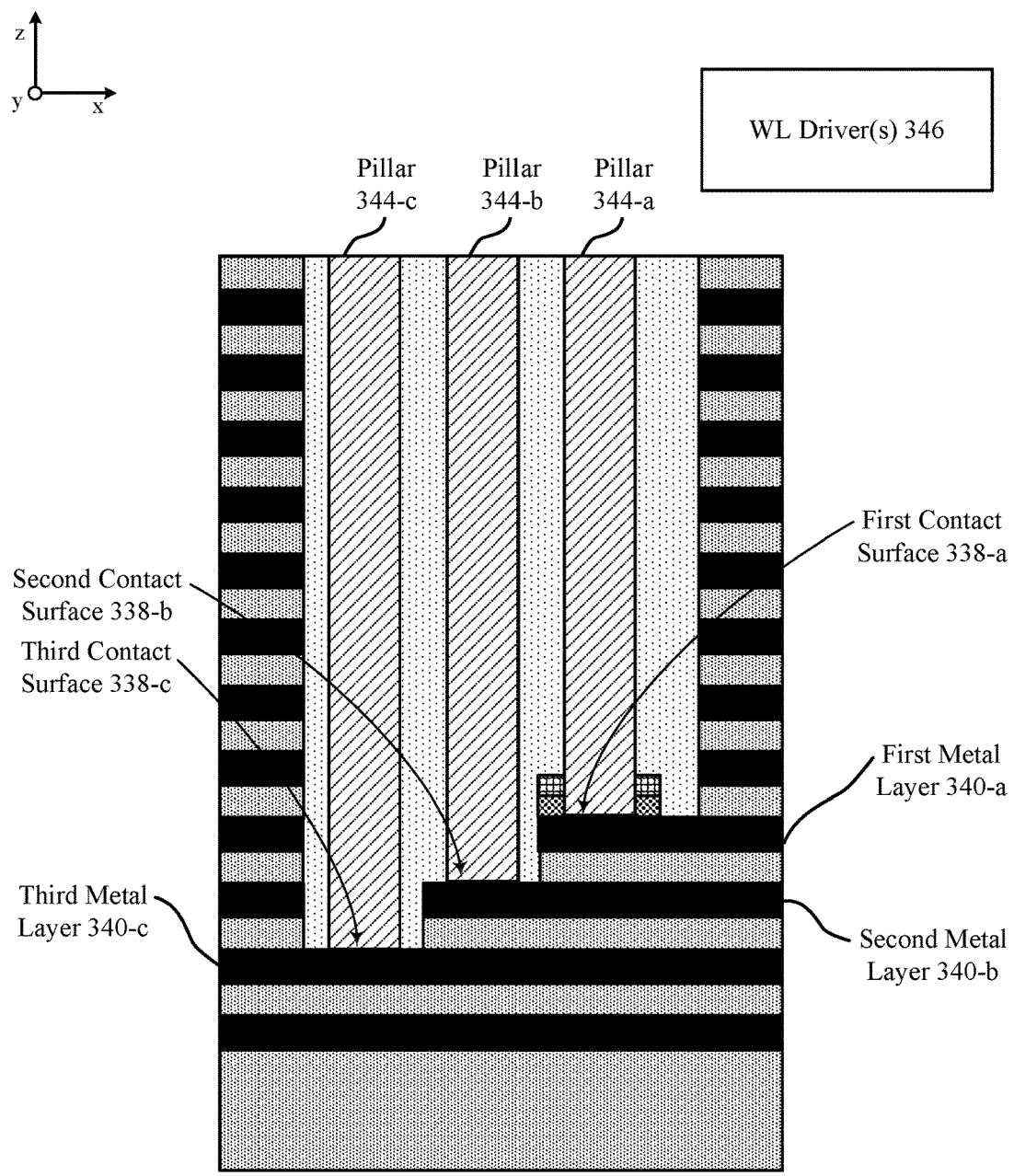

FIGS. 3A through 3N illustrate examples of a material structure at different stages of a second process that forms multiple lateral contact surfaces in a word line staircase. In the second process, some of a first liner material is removed before a second liner material is deposited. The second process (and corresponding material structure 300) may be similar to the first process (and corresponding material structure 200) and descriptions from the first process and material structure 200 may be imputed to the second process and material structure unless otherwise indicated. FIGS. 3A through 3N show a cross-section view of the material structure 300. Aspects of the material structure 300 may be described with reference to an x-direction, a y-direction, and a z-direction of the illustrated coordinate system.

FIG. 3A illustrates an example of the material structure 300 after a first liner material 308 is deposited in a cavity 302 of a set of stacked materials 312. Aspects of the material structure 300 may be described with reference to an x-direction, a y-direction, and a z-direction of the illustrated coordinate system. A dry-etch process may be used to form the cavity 302. The first liner material 308 may be deposited after the cavity 302 is formed as described with reference to FIG. 2A. The stacked materials 312 may include alternating materials (e.g., formed as layers). For examples, the stacked materials 312 may include a dielectric material (e.g., oxide) formed as dielectric layers 306 and may include a sacrificial material (e.g., nitride) formed as sacrificial layers 304. The stacked materials 312 may include a first sidewall 310-*a* and a second sidewall 310-*b*.

FIG. 3B illustrates an example of the material structure 300 after selectively doping a portion of the first liner material 308 to form a doped portion 314. In some examples, doping the portion of the first liner material 308 may include doping the first liner material 214 with boron. In some examples, a resist material 316-*a* may block some of the first liner material 214 from the doping. Doping the portion of the first liner material 308 may change the properties of the doped portion 314 so that the doped portion 314 is more resistant to some removal processes (e.g., wet-etching) relative to the un-doped first liner material 308. However, the doped portion 314 may be susceptible to other removal processes (e.g., dry etching).

FIG. 3C illustrates an example of the material structure 300 after removing (e.g., via wet-etching) some of the first liner material 308 and leaving the doped portion 314. Removal of some of the first liner material 214 may allow for sections of the stacked materials 312 to be removed in a subsequent removal process. Retention of the doped portion 314 may help protect the first contact surface from exposure or removal during subsequent removal processes.

FIG. 3D illustrates an example of the material structure 300 after depositing a second liner material 318 and selectively doping a portion of the second liner material 318 to form a doped portion 320. In some examples, doping the portion of the second liner material 318 may include doping the second liner material 318 with carbon (e.g., implanted carbon). In some examples, a resist material 316-*b* may block some of the second liner material 318 from the doping. Doping the portion of the second liner material 318 may change the properties of the doped portion 320 so that the doped portion 320 is more resistant to some removal processes (e.g., wet-etching) relative to the un-doped second liner material 318. However, the doped portion 320 may be susceptible to other removal processes (e.g., dry etching).

FIG. 3E illustrates an example of the material structure 300 after removing (e.g., via wet-etching) some of the second liner material 318 and leaving the doped portion 320 (as well as the doped portion 314). Removal of some of the second liner material 318 may allow for sections of the stacked materials 312 to be removed in a subsequent removal process. Retention of the doped portion 320 may help protect the first contact surface from exposure or removal during subsequent removal processes.

In some examples, removing some of the first liner material 214 may expose a portion 324 of the stacked materials 312 and may form a gap 323 that is between the doped portion 314, the doped portion 320, and the second sidewall 310-*b*. The width of the gap (e.g., in the x-direction) may be based on (e.g., equal to) the thickness (e.g., in the x-direction) of the first liner material 308, which may be equal to the thickness of the second liner material 318.

FIG. 3F illustrates an example of the material structure 300 after a portion 324 of a gap fill material, such as a dielectric material, is formed. The portion 324 may be formed using a technique similar to that described with reference to FIGS. 2H and 2I. For example, a dielectric film may be deposited in the cavity 302 so that the dielectric film overlays one or more of the first sidewall 310-*a*, the second sidewall 310-*b*, the first sacrificial layer 304-*a*, the doped portion 314, and the doped portion 320. So, addition of the dielectric film may fill the gap 323 formed by the removal process used to remove some of the second liner material 318. After depositing the dielectric film, some of the dielectric film may be removed and the portion 324 may be retained so that the first sacrificial layer 304-*a* is protected against a subsequent removal process.

FIG. 3G illustrates an example of the material structure 300 after removing (e.g., via wet etching) a section of the first sacrificial layer 304-*a* and a section of a first dielectric layer 306-*a* that is below the first sacrificial layer 304-*a*. The removal process used to remove the sections of the first sacrificial layer 304-*a* and the first dielectric layer 306-*a* may also remove the portion 324 of the dielectric film, thereby re-exposing the portion 324 of the stacked materials 312. In an alternative (similar to Option B), a remainder of the oxide film may be retained to protect the portion 324 from another removal process.

FIG. 3H illustrates an example of the material structure 300 after cutting back the doped portion 314. For example, sub-portion 326 (shown in FIG. 3G) may be removed from the doped portion 314 of the first liner material 308 so that the ends of the doped portion 314 align (e.g., in the x-direction) with the ends of the doped portion. Removing the sub-portion 326 may expose a section of the first sacrificial layer 304-a that is above the second contact surface (so that the second contact surface can be exposed during a subsequent removal process).

FIG. 3I illustrates an example of the material structure 300 after a portion 328 of a gap fill material, such as a dielectric material, is formed. The portion 328 may be formed using a technique similar to that described with reference to FIGS. 2H and 2I. So, addition of the dielectric film may fill the gap 323 formed by the removal process used to remove the sections of the first sacrificial layer 304-a and the first dielectric layer 306-a. After depositing the dielectric film, some of the dielectric film may be removed and the portion 328 may be retained so that the first sacrificial layer 304-a is protected against a subsequent removal process. In an alternative (similar to Option B), the portion 328 may be a remainder of the oxide film that was retained to protect the portion 324 from a subsequent removal process.

FIG. 3J illustrates an example of the material structure 300 after removing (e.g., via wet-etching) sections of the stacked materials (e.g., sections of the first sacrificial layer 304-a, the first dielectric layer 306-a, the second sacrificial layer 304-b, and the second dielectric layer 306-b). The first contact surface 330 may be protected against removal by the doped portion 314 and the doped portion 320. Removing the sections of the stacked materials 312 may expose the second contact surface 332 and the third contact surface 334. The removal process used to remove the sections of the stacked materials 312 may also remove the portion 328 of the dielectric film.

FIG. 3K illustrates an example of the material structure 300 after depositing an oxide material 336 within the cavity 302. The oxide material 336 may be deposited so that the oxide material 336 fills the cavity 302 and overlays the first sidewall 310-a, the second sidewall 310-b, the second contact surface 332, the third contact surface 334, and the stack of the doped portion 314 and the doped portion 320. The oxide material 336 may be deposited to allow for the formation of conductive pillars (e.g., word line contacts) within the material structure 300, among other purposes. In an alternative (similar to Option C), the stack of the doped portion 314 and the doped portion 320 may be removed before depositing the oxide material 336.

FIG. 3L illustrates an example of the material structure 300 after replacing the sacrificial material with a metal material. For example, the first sacrificial layer 304-a may be replaced by a first metal layer 340-a that forms a first word line coupled with a first memory cell. Similarly, the second sacrificial layer 304-b may be replaced by a second metal layer 340-b that forms a second word line coupled with a second memory cell. And the third sacrificial layer 304-c may be replaced by a third metal layer 340-c that forms a third word line coupled with a third memory cell. Thus, the material structure 300 may include a first contact surface 338-a of the first metal layer 340-a, a second contact surface 338-b of the second metal layer 340-b, and a third contact surface 338-c of the third metal layer 340-c.

FIG. 3M illustrates an example of the material structure 300 after forming elongated cavities, such as cavity 342-a, cavity 342-b, and cavity 342-c, in the material structure 300. In some examples, a dry-etching process may be used to form the cavities. The cavities 342 may be formed through the oxide material 336. Additionally, the cavity 248-a may be formed through the stack of the doped portion 220 and the doped portion 226.

The metal layers 340 may act as etch stops so that the cavities stop at the metal layers 340. However, the doped portion 314 and the doped portion 320 may be susceptible to dry-etching, so the cavity 248-a may extend through the doped portion 314 and the doped portion 320 to the first metal layer 340-a. So, forming the cavities 342 may expose the first contact surface 338-a, the second contact surface 338-b, and the third contact surface 338-c.

FIG. 3N illustrates an example of the material structure 300 after forming conductive (e.g., metal) pillars, such as pillar 344-a, pillar 344-b, and pillar 344-c, within the elongated cavities 342.

Pillar 344-a may be a first word line contact above the first contact surface 338-a of the first metal layer 340-a (the first word line) and may be coupled with or even contact the first contact surface 338-a. Pillar 344-b may be a second word line contact above the second contact surface 338-b of the second metal layer 340-b (the second word line) and may be coupled with or even contact the second contact surface 338-b. Pillar 344-c may be a third word line contact above the third contact surface 338-c of the third metal layer 340-c (the third word line) and may be coupled with or even contact the third contact surface 338-c. In some examples, the pillars 344 may be coupled with one or more word line driver(s) 346 or other component that is configured to apply electrical signals to the word lines 340 via the pillars 344.

Thus, the material structure 300 may include three word line contact surfaces 338 (lateral sub-treads), which may reduce the area consumed by the word line contacts (pillars 344).

Figure 4:
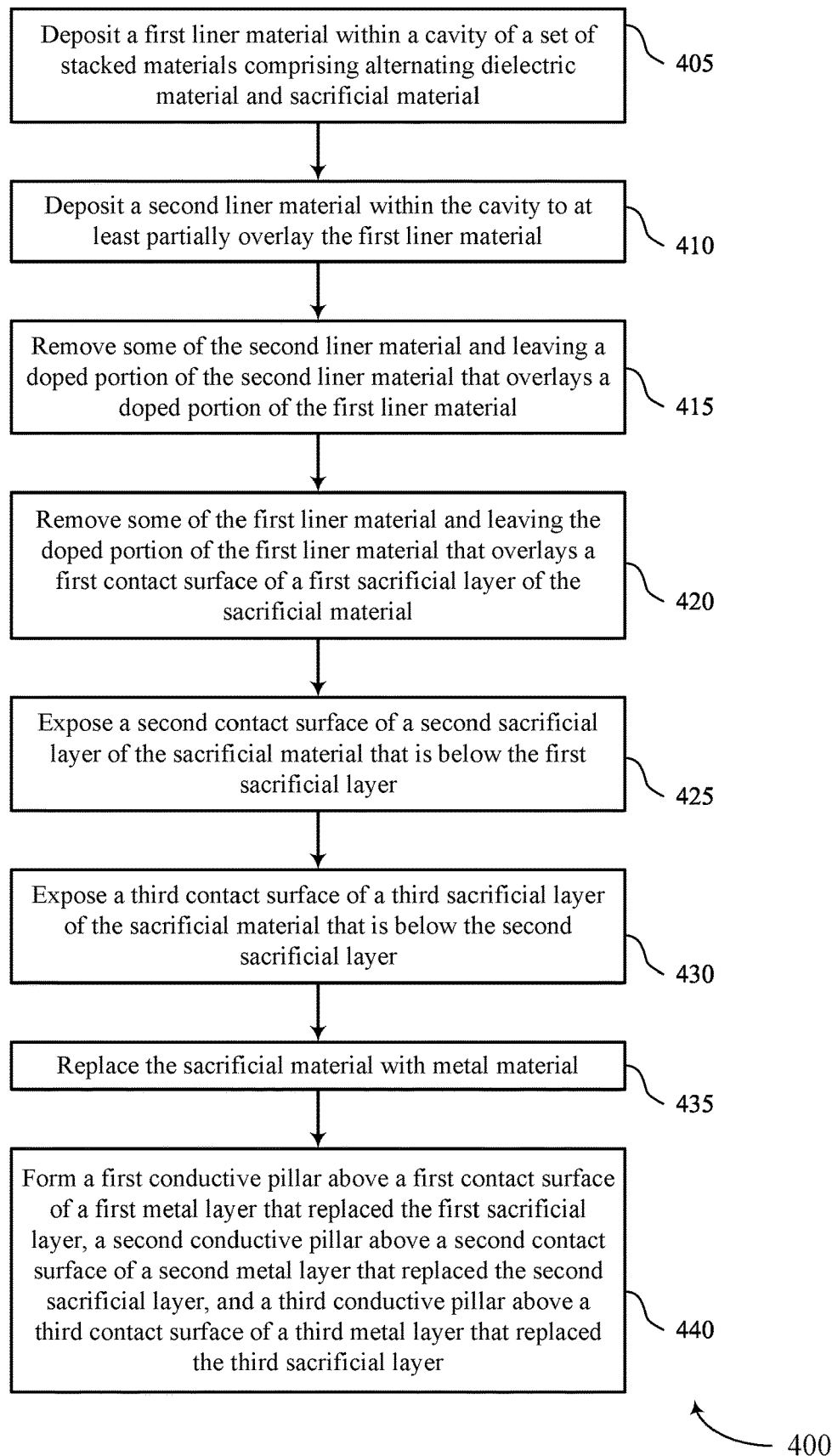
FIGS. 4 and 5 show flowcharts illustrating a method or methods that support staircase formation in a memory array in accordance with examples as disclosed herein.

FIG. 4 shows a flowchart illustrating a method 400 that supports staircase formation in a memory array in accordance with examples as disclosed herein. The operations of method 400 (which may be associated with the first process described with reference to FIGS. 2A through 2N) may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 405, the method may include depositing a first liner material within a cavity of a set of stacked materials including alternating dielectric material and sacrificial material. The operations of 405 may be performed in accordance with examples as disclosed herein.

At 410, the method may include depositing a second liner material within the cavity to at least partially overlay the first liner material. The operations of 410 may be performed in accordance with examples as disclosed herein.

At 415, the method may include removing some of the second liner material and leaving a doped portion of the second liner material that overlays a doped portion of the first liner material. The operations of 415 may be performed in accordance with examples as disclosed herein.

At 420, the method may include removing some of the first liner material and leaving the doped portion of the first liner material that overlays a first contact surface of a first sacrificial layer of the sacrificial material. The operations of 420 may be performed in accordance with examples as disclosed herein.

At 425, the method may include exposing a second contact surface of a second sacrificial layer of the sacrificial material that is below the first sacrificial layer. The operations of 425 may be performed in accordance with examples as disclosed herein.

At 430, the method may include exposing a third contact surface of a third sacrificial layer of the sacrificial material that is below the second sacrificial layer. The operations of 430 may be performed in accordance with examples as disclosed herein.

At 435, the method may include replacing the sacrificial material with metal material. The operations of 435 may be performed in accordance with examples as disclosed herein.

At 440, the method may include forming a first conductive pillar above a first contact surface of a first metal layer that replaced the first sacrificial layer, a second conductive pillar above a second contact surface of a second metal layer that replaced the second sacrificial layer, and a third conductive pillar above a third contact surface of a third metal layer that replaced the third sacrificial layer. The operations of 440 may be performed in accordance with examples as disclosed herein.

In some examples, an apparatus (e.g., a manufacturing system) as described herein may perform a method or methods, such as the method 400. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for depositing a first liner material within a cavity of a set of stacked materials including alternating dielectric material and sacrificial material; depositing a second liner material within the cavity to at least partially overlay the first liner material; removing some of the second liner material and leaving a doped portion of the second liner material that overlays a doped portion of the first liner material; removing some of the first liner material and leaving the doped portion of the first liner material that overlays a first contact surface of a first sacrificial layer of the sacrificial material; exposing a second contact surface of a second sacrificial layer of the sacrificial material that is below the first sacrificial layer; exposing a third contact surface of a third sacrificial layer of the sacrificial material that is below the second sacrificial layer; replacing the sacrificial material with metal material; and forming a first conductive pillar above a first contact surface of a first metal layer that replaced the first sacrificial layer, a second conductive pillar above a second contact surface of a second metal layer that replaced the second sacrificial layer, and a third conductive pillar above a third contact surface of a third metal layer that replaced the third sacrificial layer.

Aspect 2: The method or apparatus of aspect 1, further including operations, features, circuitry, logic, means, or instructions, or any combination thereof for the first conductive pillar being at least partially formed within the doped portion of the first liner material and the doped portion of the second liner material.

Aspect 3: The method or apparatus of any of aspects 1 through 2, further including operations, features, circuitry, logic, means, or instructions, or any combination thereof for doping the portion of the first liner material based at least in part on depositing the first liner material and before depositing the second liner material.

Aspect 4: The method or apparatus of any of aspects 1 through 3, further including operations, features, circuitry, logic, means, or instructions, or any combination thereof for doping the portion of the second liner material based at least in part on depositing the second liner material and before removing some of the second liner material.

Aspect 5: The method or apparatus of any of aspects 1 through 4, further including operations, features, circuitry, logic, means, or instructions, or any combination thereof for removing a sub-portion of the doped portion of the first liner material to expose some of the first sacrificial layer, where the second contact surface of the second sacrificial layer is exposed based at least in part on removing the sub-portion.

Aspect 6: The method or apparatus of any of aspects 1 through 5, further including operations, features, circuitry, logic, means, or instructions, or any combination thereof for depositing, after removing some of the second liner material and some of the first liner material, a dielectric film to at least partially overlay the doped portion of the first liner material and the doped portion of the second liner material, the dielectric film to protect a portion of the set of stacked materials as part of exposing a sacrificial material of the set of stacked materials.

Aspect 7: The method or apparatus of aspect 6, further including operations, features, circuitry, logic, means, or instructions, or any combination thereof for removing some of the dielectric film and leaving a portion of the dielectric film between the doped portion of the first liner material, the doped portion of the second liner material, and a sidewall of the cavity.

Aspect 8: The method or apparatus of aspect 7, further including operations, features, circuitry, logic, means, or instructions, or any combination thereof for removing the portion of the dielectric film before exposing the second contact surface.

Aspect 9: The method or apparatus of any of aspects 7 through 8, further including operations, features, circuitry, logic, means, or instructions, or any combination thereof for removing some of the portion of the dielectric film and leaving a remainder of the portion of the dielectric film before exposing the second contact surface and removing the remainder of the portion of the dielectric film based at least in part on exposing the second contact surface.

Aspect 10: The method or apparatus of any of aspects 1 through 9, further including operations, features, circuitry, logic, means, or instructions, or any combination thereof for depositing oxide material within the cavity based at least in part on exposing the third contact surface of the third sacrificial layer, where the sacrificial material is replaced with the metal material after depositing the oxide material and forming elongated cavities through the oxide material, where the first, second, and third conductive pillars are each formed within a respective elongated cavity of the elongated cavities.

Figure 5:
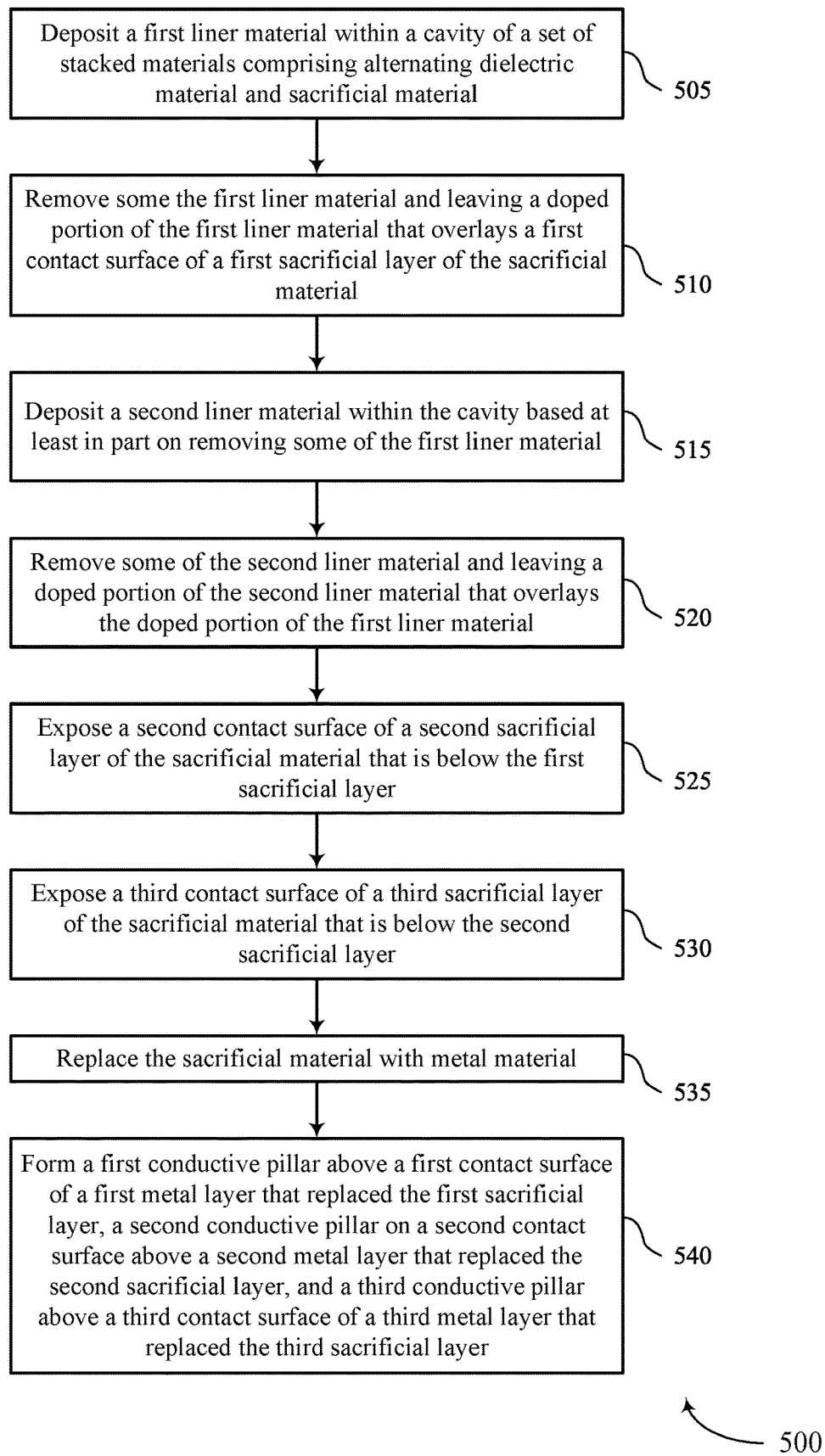

FIG. 5 shows a flowchart illustrating a method 500 that supports staircase formation in a memory array in accordance with examples as disclosed herein. The operations of method 500 (which may be associated with the second process described with reference to FIGS. 3A through 3N) may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 505, the method may include depositing a first liner material within a cavity of a set of stacked materials including alternating dielectric material and sacrificial material. The operations of 505 may be performed in accordance with examples as disclosed herein.

At 510, the method may include removing some the first liner material and leaving a doped portion of the first liner material that overlays a first contact surface of a first sacrificial layer of the sacrificial material. The operations of 510 may be performed in accordance with examples as disclosed herein.

At 515, the method may include depositing a second liner material within the cavity based at least in part on removing some of the first liner material. The operations of 515 may be performed in accordance with examples as disclosed herein.

At 520, the method may include removing some of the second liner material and leaving a doped portion of the second liner material that overlays the doped portion of the first liner material. The operations of 520 may be performed in accordance with examples as disclosed herein.

At 525, the method may include exposing a second contact surface of a second sacrificial layer of the sacrificial material that is below the first sacrificial layer. The operations of 525 may be performed in accordance with examples as disclosed herein.

At 530, the method may include exposing a third contact surface of a third sacrificial layer of the sacrificial material that is below the second sacrificial layer. The operations of 530 may be performed in accordance with examples as disclosed herein.

At 535, the method may include replacing the sacrificial material with metal material. The operations of 535 may be performed in accordance with examples as disclosed herein.

At 540, the method may include forming a first conductive pillar above a first contact surface of a first metal layer that replaced the first sacrificial layer, a second conductive pillar on a second contact surface above a second metal layer that replaced the second sacrificial layer, and a third conductive pillar above a third contact surface of a third metal layer that replaced the third sacrificial layer. The operations of 540 may be performed in accordance with examples as disclosed herein.

In some examples, an apparatus (e.g., a manufacturing system) as described herein may perform a method or methods, such as the method 500. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 11: A method or apparatus including operations, features, circuitry, logic, means, or instructions, or any combination thereof for depositing a first liner material within a cavity of a set of stacked materials including alternating dielectric material and sacrificial material; removing some the first liner material and leaving a doped portion of the first liner material that overlays a first contact surface of a first sacrificial layer of the sacrificial material; depositing a second liner material within the cavity based at least in part on removing some of the first liner material; removing some of the second liner material and leaving a doped portion of the second liner material that overlays the doped portion of the first liner material; exposing a second contact surface of a second sacrificial layer of the sacrificial material that is below the first sacrificial layer; exposing a third contact surface of a third sacrificial layer of the sacrificial material that is below the second sacrificial layer; replacing the sacrificial material with metal material; and forming a first conductive pillar above a first contact surface of a first metal layer that replaced the first sacrificial layer, a second conductive pillar on a second contact surface above a second metal layer that replaced the second sacrificial layer, and a third conductive pillar above a third contact surface of a third metal layer that replaced the third sacrificial layer.

Aspect 12: The method or apparatus of aspect 11, where the first conductive pillar is at least partially formed within the doped portion of the first liner material and the doped portion of the second liner material.

Aspect 13: The method or apparatus of any of aspects 11 through 12, further including operations, features, circuitry, logic, means, or instructions, or any combination thereof for doping the portion of the first liner material based at least in part on depositing the first liner material.

Aspect 14: The method or apparatus of any of aspects 11 through 13, further including operations, features, circuitry, logic, means, or instructions, or any combination thereof for doping the portion of the second liner material based at least in part on depositing the second liner material.

Aspect 15: The method or apparatus of any of aspects 11 through 14, further including operations, features, circuitry, logic, means, or instructions, or any combination thereof for removing a sub-portion of the doped portion of the first liner material to expose some of the first sacrificial layer, where the second contact surface of the second sacrificial layer is exposed based at least in part on removing the sub-portion.

Aspect 16: The method or apparatus of any of aspects 11 through 15, further including operations, features, circuitry, logic, means, or instructions, or any combination thereof for depositing, after removing some of the second liner material, a dielectric film to at least partially overlay the doped portion of the first liner material and the doped portion of the second liner material, the dielectric film to protect a portion of the set of stacked materials as part of exposing a sacrificial material of the set of stacked materials.

Aspect 17: The method or apparatus of aspect 16, further including operations, features, circuitry, logic, means, or instructions, or any combination thereof for removing some of the dielectric film and leaving a portion of the dielectric film between the doped portion of the first liner material, the doped portion of the second liner material, and a sidewall of the cavity.

Aspect 18: The method or apparatus of aspect 17, further including operations, features, circuitry, logic, means, or instructions, or any combination thereof for removing the portion of the dielectric film before exposing the second contact surface.

Aspect 19: The method or apparatus of any of aspects 17 through 18, further including operations, features, circuitry, logic, means, or instructions, or any combination thereof for removing some of the portion of the dielectric film and leaving a remainder of the portion of the dielectric film before exposing the second contact surface and removing the remainder of the portion of the dielectric film based at least in part on exposing the second contact surface.

Aspect 20: The method or apparatus of any of aspects 11 through 19, further including operations, features, circuitry, logic, means, or instructions, or any combination thereof for depositing oxide material within the cavity based at least in part on exposing the third contact surface of the third sacrificial layer, where the sacrificial material is replaced with the metal material after depositing the oxide material and forming elongated cavities through the oxide material, where the first, second, and third conductive pillars are each formed within a respective elongated cavity of the elongated cavities.

It should be noted that the described methods include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 21: An apparatus, including: a set of stacked materials including alternating dielectric material and metal material; a first word line contact including a first conductive pillar coupled with a first contact surface of a first word line that includes a first metal layer of the metal material; a second word line contact including a second conductive pillar coupled with a second contact surface of a second word line that includes a second metal layer of the metal material that is above the first metal layer; and a third word line contact including a third conductive pillar disposed through a stack of a first liner material and a second liner material and coupled with a third contact surface of a third word line that includes a third metal layer of the metal material that is above the second metal layer.

Aspect 22: The apparatus of aspect 21, further including: a word line driver coupled with the third word line contact.

Aspect 23: The apparatus of any of aspects 21 through 22, where the first liner material is disposed on the second liner material, and the second liner material is disposed on the third metal layer.

Aspect 24: The apparatus of any of aspects 21 through 23, further including: an oxide material at least partially surrounding the first conductive pillar, the second conductive pillar, and the third conductive pillar.

Aspect 25: The apparatus of any of aspects 21 through 24, further including: a first dielectric layer between the first metal layer and the second metal layer; and a second dielectric layer between the second metal layer and the third metal layer.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    depositing a first liner material within a cavity of a set of stacked materials comprising alternating dielectric material and sacrificial material;
    depositing a second liner material within the cavity to at least partially overlay the first liner material;
    removing some of the second liner material and leaving a doped portion of the second liner material that overlays a doped portion of the first liner material;
    removing some of the first liner material and leaving the doped portion of the first liner material that overlays a first contact surface of a first sacrificial layer of the sacrificial material;
    exposing a second contact surface of a second sacrificial layer of the sacrificial material that is below the first sacrificial layer;
    exposing a third contact surface of a third sacrificial layer of the sacrificial material that is below the second sacrificial layer;
    replacing the sacrificial material with metal material; and
    forming a first conductive pillar above a first contact surface of a first metal layer that replaced the first sacrificial layer, a second conductive pillar above a second contact surface of a second metal layer that replaced the second sacrificial layer, and a third conductive pillar above a third contact surface of a third metal layer that replaced the third sacrificial layer.

2. The method of claim 1, wherein the first conductive pillar is at least partially formed within the doped portion of the first liner material and the doped portion of the second liner material.

3. The method of claim 1, further comprising:
    doping the portion of the first liner material after depositing the first liner material and before depositing the second liner material.

4. The method of claim 1, further comprising: doping the portion of the second liner material after depositing the second liner material and before removing some of the second liner material.

5. The method of claim 1, further comprising:
    removing a sub-portion of the doped portion of the first liner material to expose some of the first sacrificial layer, wherein the second contact surface of the second sacrificial layer is exposed based at least in part on removing the sub-portion.

6. The method of claim 1, further comprising:
    depositing, after removing some of the second liner material and some of the first liner material, a dielectric film to at least partially overlay the doped portion of the first liner material and the doped portion of the second liner material, the dielectric film to protect a portion of the set of stacked materials as part of exposing the sacrificial material of the set of stacked materials.

7. The method of claim 6, further comprising:
    removing some of the dielectric film and leaving a portion of the dielectric film between the doped portion of the first liner material, the doped portion of the second liner material, and a sidewall of the cavity.

8. The method of claim 7, further comprising:
    removing the portion of the dielectric film before exposing the second contact surface.

9. The method of claim 7, further comprising:
    removing some of the portion of the dielectric film and leaving a remainder of the portion of the dielectric film before exposing the second contact surface; and
    removing the remainder of the portion of the dielectric film after exposing the second contact surface.

10. The method of claim 1, further comprising:
    depositing oxide material within the cavity after exposing the third contact surface of the third sacrificial layer, wherein the sacrificial material is replaced with the metal material after depositing the oxide material; and
    forming elongated cavities through the oxide material, wherein the first conductive pillar, the second conductive pillar, and the third conductive pillar are each formed within a respective elongated cavity of the elongated cavities.

* * * * *